United States Patent
Vimercati et al.

(10) Patent No.: US 11,244,733 B2
(45) Date of Patent: Feb. 8, 2022

(54) MITIGATING DISTURBANCES OF MEMORY CELLS

(71) Applicant: Micron Technology, Inc., Boise, ID (US)

(72) Inventors: Daniele Vimercati, El Dorado Hills, CA (US); Mark Fischer, Meridian, ID (US); Adam D. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 16/685,309

(22) Filed: Nov. 15, 2019

(65) Prior Publication Data

US 2020/0090768 A1    Mar. 19, 2020

Related U.S. Application Data

(62) Division of application No. 15/669,785, filed on Aug. 4, 2017, now Pat. No. 10,510,423.

(51) Int. Cl.
| | |
|---|---|
| *G11C 11/34* | (2006.01) |
| *G11C 16/04* | (2006.01) |
| *G11C 16/34* | (2006.01) |
| *G11C 11/56* | (2006.01) |
| *G11C 11/22* | (2006.01) |

(52) U.S. Cl.
CPC ........ *G11C 16/3427* (2013.01); *G11C 11/221* (2013.01); *G11C 11/2273* (2013.01); *G11C 11/2275* (2013.01); *G11C 11/5628* (2013.01); *G11C 11/5642* (2013.01); *G11C 16/0483* (2013.01)

(58) Field of Classification Search
CPC ............. G11C 11/221; H01L 27/11507; H01L 27/1159; H01L 27/10805; H01L 29/78391; H01L 29/4966; H01L 28/55
See application file for complete search history.

(56) References Cited

U.S. PATENT DOCUMENTS

| | | | |
|---|---|---|---|
| 9,715,918 B1 | 7/2017 | Kawamura | |
| 9,886,991 B1 | 2/2018 | Vimercati et al. | |
| 10,153,021 B1 | 12/2018 | Di Vincenzo | |
| 2005/0082583 A1* | 4/2005 | Lian ........................ | H01L 28/55 257/295 |
| 2005/0093040 A1* | 5/2005 | Lian ........................ | H01L 28/55 257/295 |
| 2005/0259461 A1 | 11/2005 | Yamaoka et al. | |

(Continued)

*Primary Examiner* — Toan K Le
(74) *Attorney, Agent, or Firm* — Holland & Hart LLP

(57) ABSTRACT

Methods, systems, and devices for techniques to mitigate disturbances of unselected memory cells in a memory array during an access operation are described. A shunt line may be formed between a plate of a selected memory cell and a digit line of the selected memory cell to couple the plate to the digit line during the access operation. A switching component may be positioned on the shunt line. The switching component may selectively couple the plate to the digit line based on instructions received from a memory controller. By coupling the plate to the digit line during the access operation, voltages resulting on the plate by changes in the voltage level of the digit line may be reduced in magnitude or may be altered in type.

19 Claims, 17 Drawing Sheets

(56) References Cited

U.S. PATENT DOCUMENTS

| | | | |
|---|---|---|---|
| 2006/0118841 A1* | 6/2006 | Eliason | H01L 27/11502 257/295 |
| 2006/0134808 A1* | 6/2006 | Summerfelt | H01L 28/57 438/3 |
| 2007/0189059 A1 | 8/2007 | Gogl | |
| 2012/0069633 A1 | 3/2012 | Katoh | |
| 2017/0270991 A1 | 9/2017 | Kawamura et al. | |

* cited by examiner

US 11,244,733 B2

MITIGATING DISTURBANCES OF MEMORY CELLS

CROSS REFERENCE

The present application for patent is a divisional of and claims priority to and the benefit of U.S. patent application Ser. No. 15/669,785 by Vimercati et al., entitled "MITIGATING DISTURBANCES OF MEMORY CELLS." filed Aug. 4, 2017, assigned to the assignee hereof, and is expressly incorporated by reference in its entirety herein.

BACKGROUND

The following relates generally to mitigating disturbances of memory cells in a memory array and more specifically to address capacitive coupling between components in the memory array.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. Disturbances or noise resulting from other portions of an array may negatively affect such metrics.

DETAILED DESCRIPTION

Disturbances of unselected memory cells in an array of ferroelectric memory cells during an access operation may be mitigated to improve various performance metrics for the array. For instance, capacitive coupling between components in the memory array may be reduced by grounding or virtually grounding a plate coupled to ferroelectric memory cells of the array and discharging a digit line as part of an access operation.

By way of example, some memory arrays include plates that are coupled to more than one memory cell. During an access operation one memory cell coupled to a plate may be selected, while the remaining memory cells are not selected, these memory cells may be referred to as the unselected memory cells. During an access operation of a selected memory cell, the plate may become capacitively coupled to a digit line of the selected memory cell. When such coupling occurs changes in the voltage level of one component (e.g., the plate or the digit line) may induce voltages on the other component (e.g., the digit line or the plate). More specifically, during a read operation a voltage change in the digit line may induce transient voltages on a plate line. The induced voltages may be undesirable and may modify logic states of unselected memory cells coupled to the plate line. For example, when the plate is grounded or virtually grounded and the digit line moves from a high voltage to a ground or virtual ground voltage, such movement may induce a negative voltage on the plate.

Devices and techniques are described herein to mitigate disturbances of unselected memory cells in a memory array during an access operation caused by capacitive coupling between components in the memory array. A shunt line may be formed between a plate of a selected memory cell and a digit line of the selected memory cell to couple the plate to the digit line during the access operation. A switching component may be positioned on the shunt line. The switching component may selectively couple the plate to the digit line based on instructions received from a memory controller. By coupling the plate to the digit line during the access operation, voltages induced on the plate by changes in the voltage level of the digit line may be reduced in magnitude or may be altered in type. For example, capacitive coupling between the plate line and the digit line may cause negative voltages to form during an access operation, but by coupling the plate to the digit line the induced voltages may become positive voltages and/or may be reduced in magnitude.

Features of the disclosure introduced above are further described below in the context of memory arrays, circuits, and timing diagrams. These and other features of the disclosure are further illustrated by and described with reference to apparatus diagrams, system diagrams, and flowcharts that relate to techniques to mitigate disturbances of memory cells.

Figure 1:
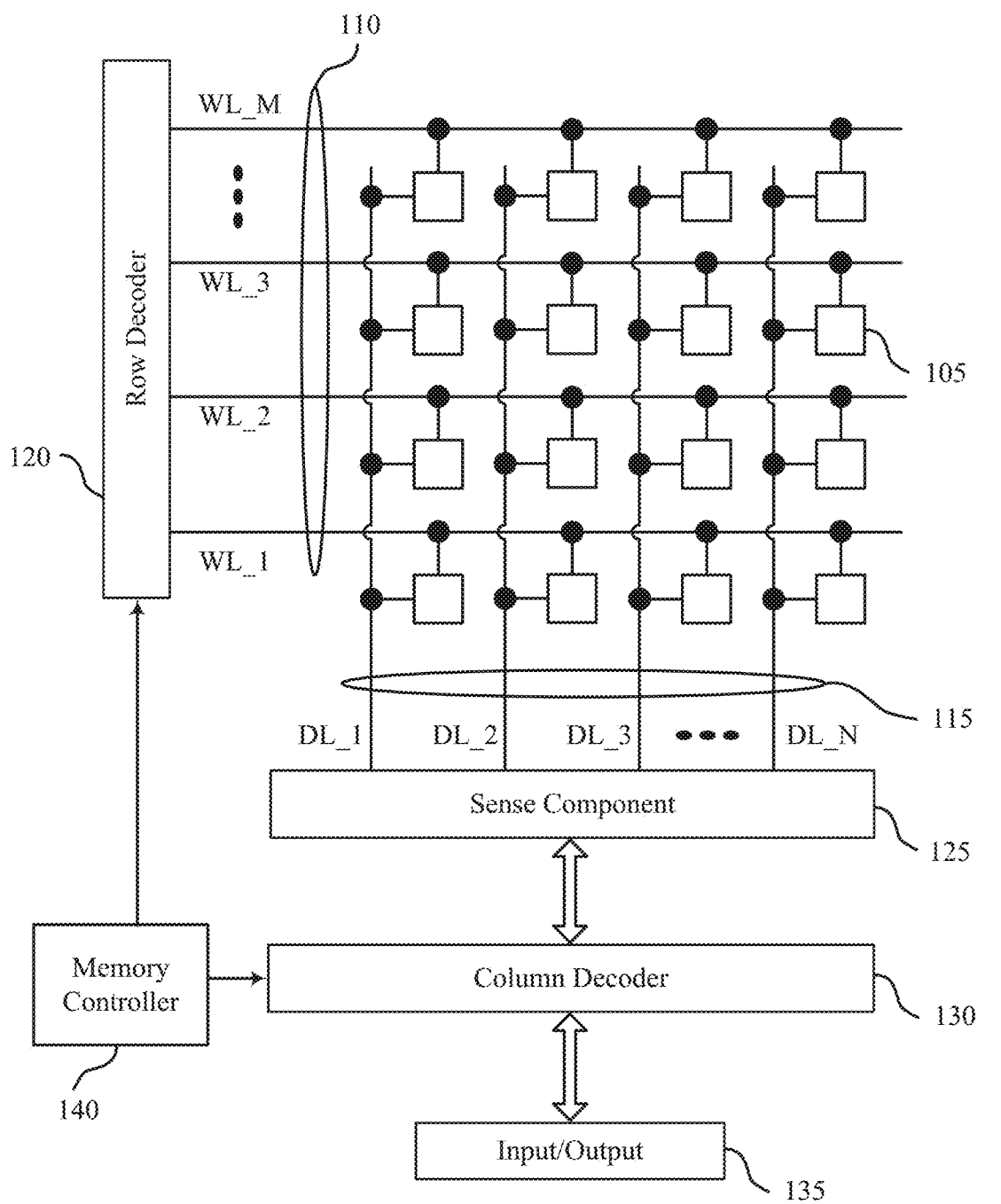
FIG. 1 illustrates an example of a memory array that supports techniques to mitigate disturbances of memory cells in accordance with embodiments of the present disclosure.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. In some examples, a read operation of a memory cell may include activating switching components to shunt or couple a digit line 115 to a plate of the ferroelectric memory cell (not shown in FIG. 1).

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row, thus, several or all memory cells 105 in the row may need to be re-written. As described with more detail below, in some write back operations of a memory cell, voltages may be induced on a plate of the ferroelectric memory cell based on actions performed on the digit line 115 of the memory cell 105. In such situations, the digit line 115 may be shunted to the plate during the write back operation to modify the magnitude and the type of the induced voltages.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state. As should be appreciated, the operations of a memory controller 140 may be modified based on the memory array including the shunt lines and the shunt switching components described in more detail below.

Figure 2:
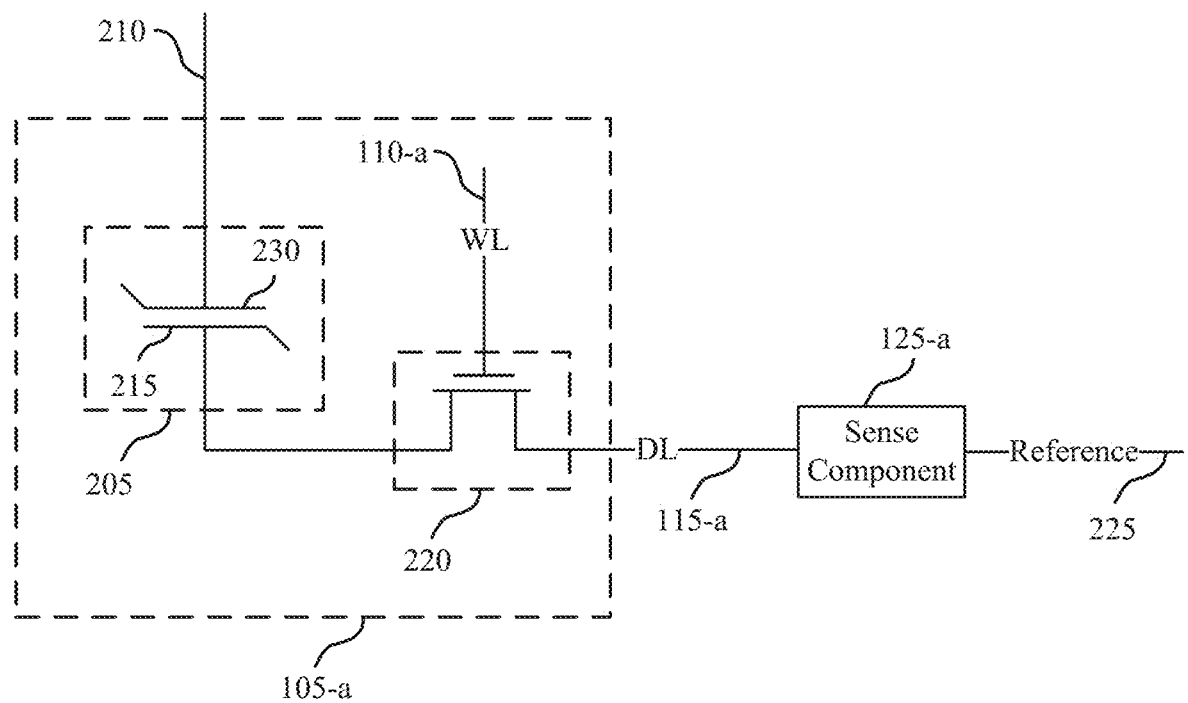
FIG. 2 illustrates an example of a circuit of a memory cell in accordance with embodiments of the present disclosure.

FIG. 2 illustrates an example circuit 200 in accordance with various embodiments of the present disclosure. Circuit 200 includes a memory cell 105-a, word line 110-a, digit line 115-a, and sense component 125-a, which may be examples of a memory cell 105-a, word line 110-a, digit line 115-a, and sense component 125-a, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. In some examples, the cell plate 230 and the cell bottom 215 may be capacitively coupled through a dielectric material positioned between them and the plate line 210 may be a reference line (e.g., a ground line). As described above, various states may be stored by charging or discharging the capacitor 205. As is described in more detail below, shunt lines and shunt switching components may be configured to selectively couple a digit line 115-a to a plate line 210. Examples of such circuit configurations may be the first configuration 401 or the second configuration 402 described with reference to FIG. 4. However, the circuit 200 is shown in conjunction with FIG. 7 to show how voltages may be induced without the shunt lines or shunt switching devices.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate the selection component 220; for example, a voltage applied to word line 110-a is applied to the transistor gate, connecting the capacitor 205 with digit line 15-a. In addition, a sensing scheme of a memory cell 105-a may include activating and deactivating shunt switching components at different times to mitigate disturbances to unselected memory cells.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing the plate line 210 and word line 110-a. Biasing the plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 15-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105-a so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive the digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

Figure 3:
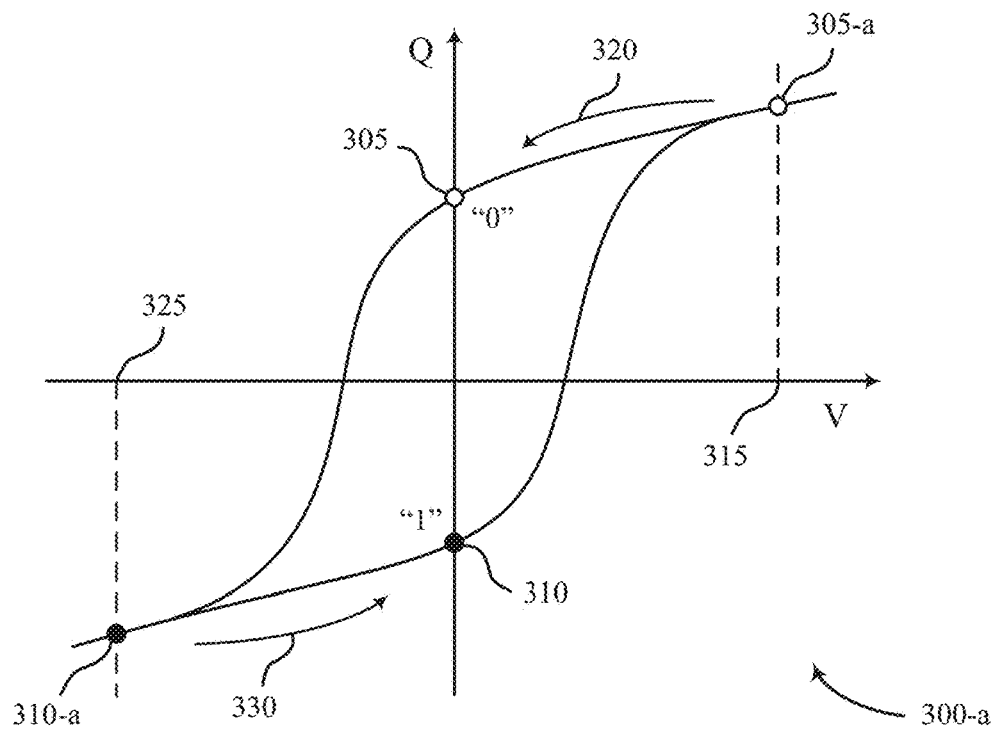
FIG. 3 illustrates an example of hysteresis curves that support techniques to mitigate disturbances of memory cells in accordance with embodiments of the present disclosure.
Figure 3:
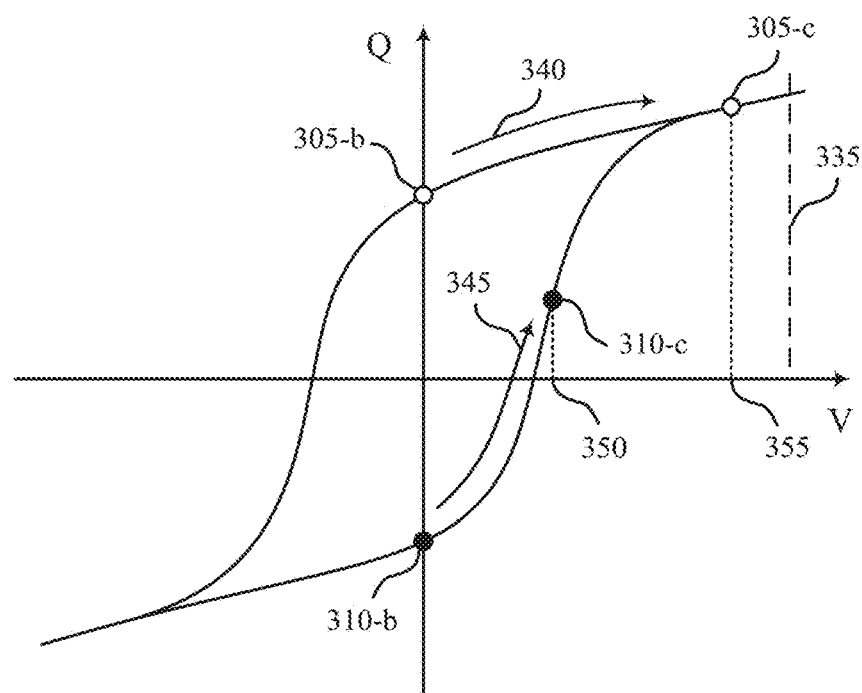

FIG. 3 illustrates an example of non-linear electrical properties with hysteresis curves 300-a and 300-b for a ferroelectric memory cell that is operated in accordance with various embodiments of the present disclosure. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO3$), lead titanate ($PbTiO3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300-a and 300-b represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal the voltage 335 and instead may depend on the voltage of the digit line. The position of final charge states 305-*c* and 310-*c* on hysteresis curve 301 may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction.

As described in more detail below, capacitive coupling may occur between various components of a ferroelectric memory cell during an access operation. Such capacitively coupling could result in voltages being induced on some components by operations performed on other components. Such induced voltages may disturb the logic states stored by the ferroelectric memory cells in a memory array.

Figure 4:
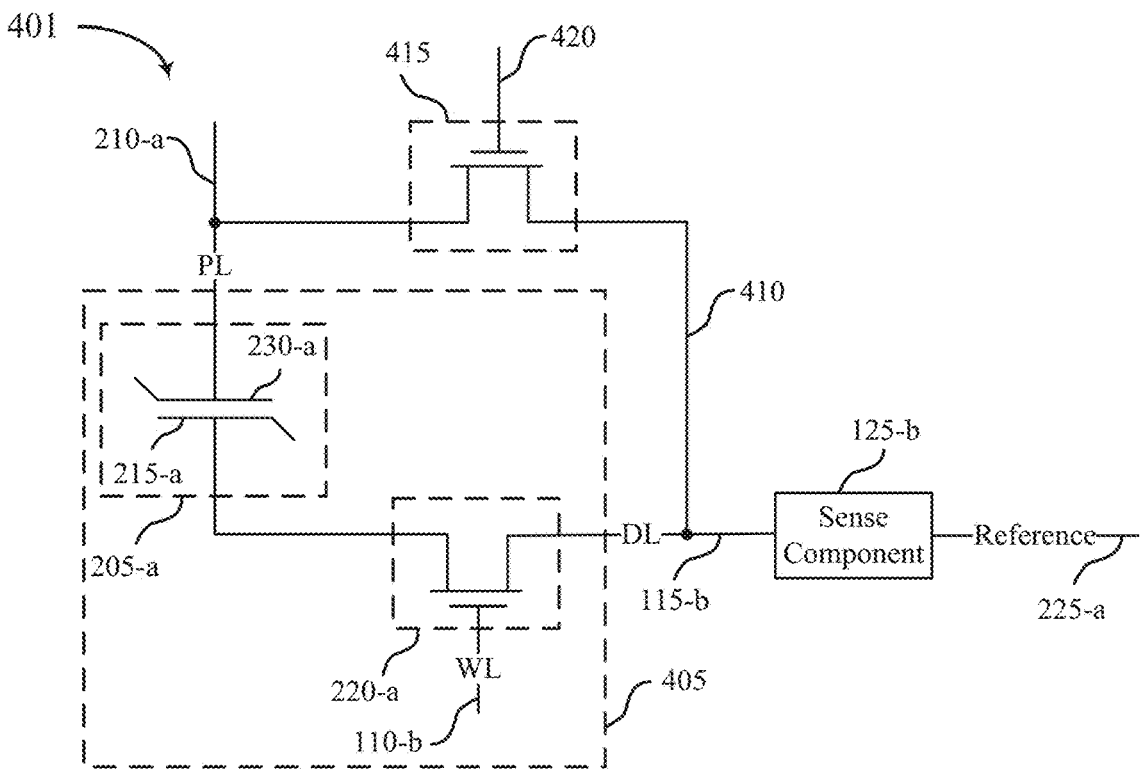
FIG. 4 illustrates an example of circuits of memory cells that support techniques to mitigate disturbances of memory cells in accordance with embodiments of the present disclosure.
Figure 4:
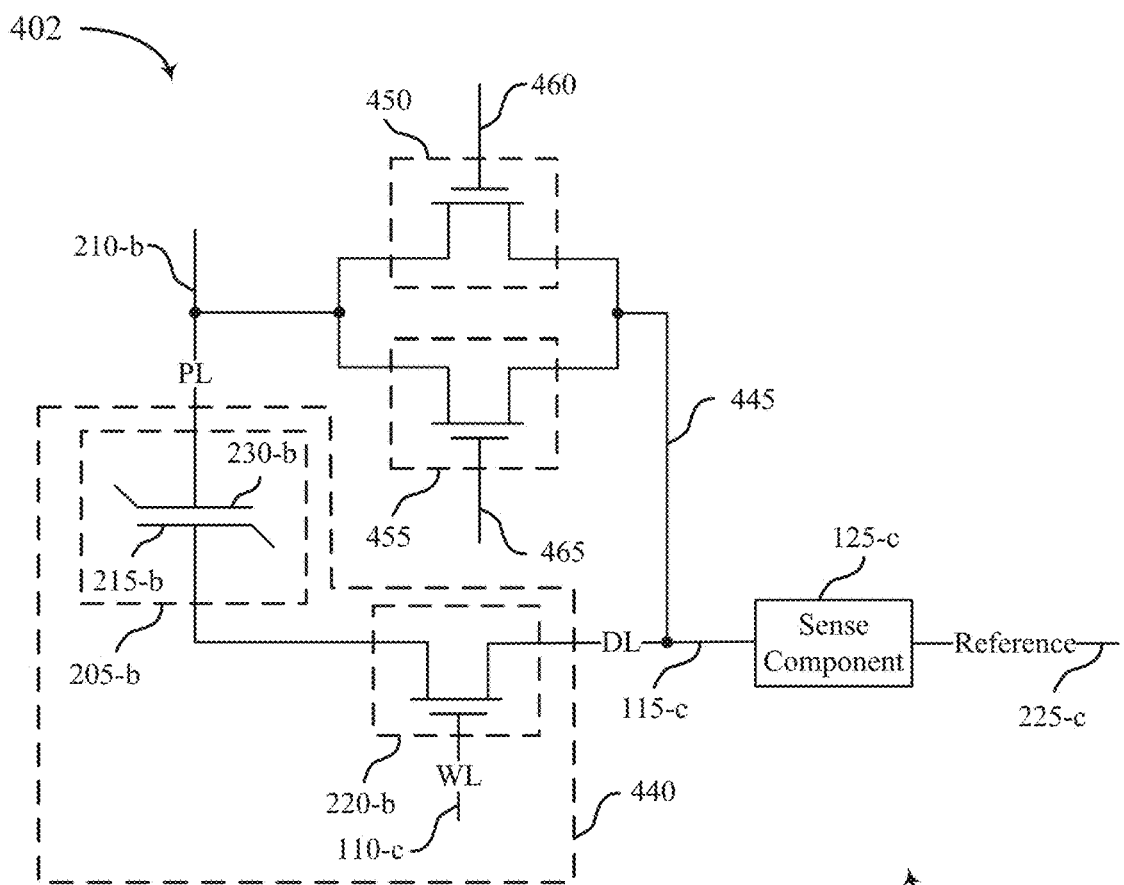

FIG. 4 illustrates an example of circuits 400 that support techniques to mitigate disturbances of memory cells in accordance with various embodiments of the present disclosure. The circuits 400 may include a first configuration 401 and a second configuration 402. The circuits 400 may be configured to mitigate disturbances to a logic state of an unselected memory cell, when performing an access operation on a selected memory cell.

In some memory arrays, access lines of memory cells may become capacitively coupled during an access operation. For example, during an access operation (e.g., read operation or write operation) a plate coupled to a selected memory cell may become capacitively coupled to a digit line also coupled to the selected memory cell. As described in more detail with reference to FIG. 7, when certain conditions are present, unwanted voltages may be induced on the plate based on changes in the voltages on the digit line. These voltage signals on the plate may disturb or alter in some way the logic states of unselected memory cells also coupled to the plate. The circuits 400 may be configured to mitigate, reduce or prevent disturbances to unselected memory cells during an access operation performed on a selected memory cell.

The first configuration 401 illustrates a circuit configured to couple, or selectively couple, the plate line 210-*a* to the digit line 115-*b* of a memory cell 405 using a single switching component. The memory cell 405 may be an example of the memory cells 105 described with reference to FIGS. 1 and 2. The first configuration 401 may include a shunt line 410 coupled to the plate line 210-*a* and the digit line 115-*b*. The shunt line 410 may be configured to couple, shunt, short, connect, or operatively couple the plate line 210-*a* of the memory cell 405 to the digit line 115-*b* of the memory cell 405.

The first configuration 401 may include a shunt switching component 415 positioned on the shunt line 410 between the plate line 210-*a* and the digit line 115-*b*. The shunt switching component 415 may be configured to selectively couple the plate line 210-*a* to the digit line 115-*b* based on instructions or commands received from a memory controller. The shunt switching component 415 may be an example of a transistor or other switching component. In some examples, the shunt switching component 415 may be similarly embodied as the selection component 220-*a*.

A shunt control line 420 may be coupled to a gate of the shunt switching component 415. The shunt control line 420 may be configured to communicate instructions from a memory controller (e.g., memory controller 140) to the shunt switching component 415. For example, the memory controller may activate the shunt switching component 415 by applying a voltage to the shunt control line 420. When the shunt switching component 415 is activated, the plate line 210-*a* may be coupled to the digit line 115-*b*. In some examples, the shunt switching component 415 may be deactivated by applying a voltage to its gate.

The second configuration 402 may include a first shunt switching component 450 and a second shunt switching component 455 positioned on a shunt line 445. The shunt line 445 may be an example of the shunt line 410. In the second configuration 402, the first and second shunt switching components 450, 455 are positioned in a parallel circuit configuration relative to one another. The first and second shunt switching components 450, 455 may cooperate to selectively couple the plate line 210-*b* to the digit line 115-*c* of a memory cell 440 based on instructions or commands received from a memory controller 140. The memory cell 440 may be an example of the memory cells 105 and 405 described with reference to FIGS. 1, 2, and 4. The first and second shunt switching components 450, 455 may be examples of a transistor or other switching component. The first and second shunt switching components 450, 455 may be similarly embodied as the shunt switching component 415 or the selection component 220-*b*.

A first control line 460 may be coupled to a gate of the first shunt switching component 450. A second control line 465 may be coupled to a gate of the second shunt switching component 455. The first and second control lines 460, 465 may be configured to communicate instructions from a memory controller (e.g., memory controller 140) to their respective shunt switching components 450, 455. The first and second control lines 460, 465 may be examples of the shunt control line 420 and may operate in similar fashions.

In some examples, the first control line 460 and the second control line 465 carry the same instructions issued by the memory controller 140. In such examples, both the first shunt switching component 450 and the second shunt switching component 455 may be activated or deactivated at the same time. In other examples, the first control line 460 and the second control line 465 carry different instructions issued by the memory controller 140. In such examples, the first shunt switching component 450 may be operated independently from the operations of the second shunt switching component 455. In some examples, the first control line 460 or the second control line 465 or both may be pre-existing control lines or access lines already found in the memory array (e.g., word line).

Figure 5:
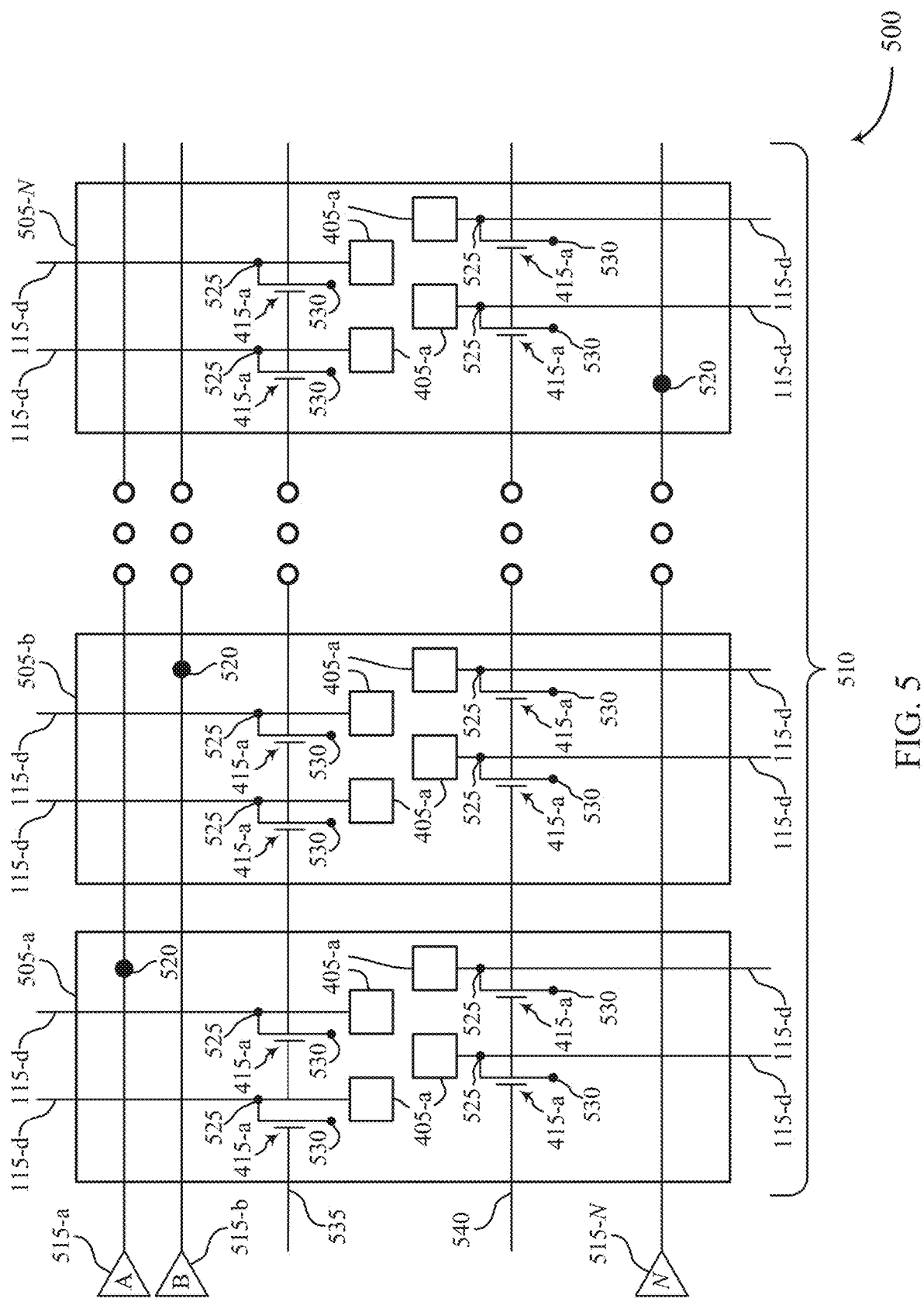
FIG. 5 illustrates an example of a memory array that supports techniques to mitigate disturbances of memory cells in accordance with embodiments of the present disclosure.

FIG. 5 illustrates an example of a memory array 500 that supports techniques to mitigate disturbances of memory cells in accordance with various embodiments of the present disclosure. FIG. 5 illustrates an example of a memory array 500 that implements the circuits 400 described with reference to FIG. 4.

The memory array 500 may include a plurality of plates 505. The plurality of plates 505 may be organized into plate groups 510 comprising a subset of the plates 505. For example, a plate group 510 may include a first plate 505-a, a second plate 505-b, up to an Nth number of plates 505-N. The memory array 500 may also include a plurality of plate drivers 515 coupled to plates at junction 520. In some examples, a single plate driver 515 may be associated with a single plate 505 of a plate group. For example, a first plate driver 515-a may be coupled to the first plate 505-a at junction 520-a, while a second plate driver 515-b may be coupled to the second plate 505-b at junction 520-b. In some examples, the first plate driver 515-a may be associated with multiple plates 505 in the same plate group 510. In some instances, the first plate driver may be associated with plates 505 in multiple plate groups 510. For example, the first plate driver 515-a may be associated with a single plate 505 from a plurality of plate groups 510. In some examples, the memory array 500 may include multiple sets of plate drivers 515.

Plates 505 may be an example of the plate line 210 discussed with reference to FIGS. 1, 2, and 4. The memory array 500 may include any number of plates 505 and may include any number of plate groups 510.

Each plate 505 is coupled to a plurality of memory cells 405-a. For example, the first plate 505-a includes four memory cells coupled to the first plate 505-a. It should be appreciated, four memory cells are illustrated for clarity purposes only. The plate 505 may be coupled to more less memory cells 405-a. Each memory cell is coupled to a digit line 115-d. The memory cells 405-a may be examples of the memory cells 104, 405, or 440 described with reference to FIGS. 1, 2, and 4.

The memory array 500 may include shunt switching components 415-a associated with the memory cells 405-a. The shunt switching components 415-a configured to selectively couple the plate 505 to the digit line 115-d. The shunt switching components 415-a are coupled to their respective digit line 115-d at junction 525. The shunt switching components 415-a are coupled to their respective plate 505 at junction 530. The shunt switching components 415-a may be positioned on a shunt line (not shown in FIG. 5) and may be configured to selectively couple the plate 505 to the digit line 115-d. The shunt switching components 415-a may be examples of the shunt switching components 415-a described with reference to FIG. 4.

The memory array 500 may include a first shunt control line 535 and a second shunt control line 540. The first shunt control line 535 and the second shunt control line 540 may be examples of the shunt control line 420 described with reference to FIG. 4. The first shunt control line 535 may be coupled to gate nodes of a first subset of shunt switching components 415-a associated with a plate 505 (e.g., the first plate 505-a). The second shunt control line 540 may be associated with a second subset of shunt switching components 415-a associated with a plate 505 (e.g., the first plate 505-a). The first subset may be mutually exclusive from the second subset. In some examples, the first subset may include a first half of the plurality of shunt switching components 415-a coupled to a plate 505 and the second subset may include a second half of the plurality of shunt switching components 415-a. In some examples, the first half is mutually exclusive from the second half.

In some examples, the first and second shunt control lines 535, 540 may be coupled to shunt switching components 415-a associated with multiple plates (e.g., the first plate 505-a and the second plate 505-b). In some examples, the memory array 500 may include any number of shunt control lines including for example, a single shunt control line, two shunt control lines, three shunt control lines, four shunt control lines, etc. In some instances, as the number of shunt control lines changes, the number of subsets of shunt switching components may also change. For example, if the memory array 500 includes four shunt control lines, the memory array 500 may include four subsets of shunt switching components. In some examples, the number of shunt control lines in the memory array 500 may be different from the number of subsets of shunt switching components in the memory array 500.

The memory array 500 includes the first configuration 401 of shunts described with reference to FIG. 4. It should be appreciated that the memory array 500 may include the second configuration 402 of shunts described with reference to FIG. 4, in some examples.

Figure 6:
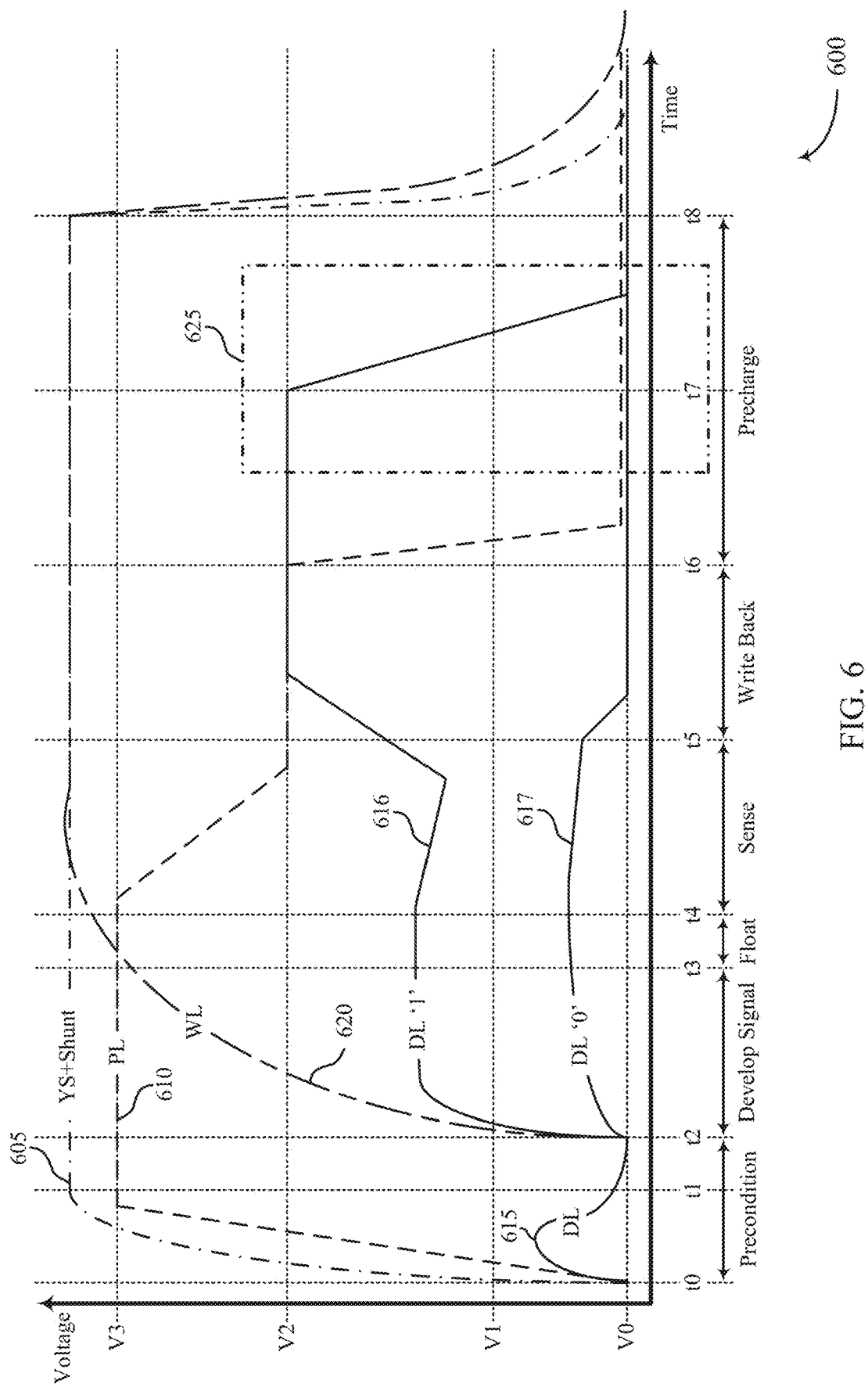
FIG. 6 illustrates an example of a timing diagram that supports techniques to mitigate disturbances of memory cells in accordance with embodiments of the present disclosure.

FIG. 6 illustrates an example of a timing diagram 600 that supports techniques to mitigate disturbances of memory cells in accordance with various embodiments of the present disclosure. The timing diagram 600 illustrates an access operation performed on a memory cell 405-a that includes one of the shunt configurations discussed with reference to FIGS. 4 and 5. More specifically, the timing diagram 600 illustrates a read operation performed on a selected memory cell 405-a. The principles of the timing diagram 600 may be applied in the context of a write operation.

At time t0, a memory controller 140 may initiate an access operation on a memory cell 405-a coupled to a plate 505 and preconditions the circuit. The memory controller 140 may select one or more memory cells coupled to a plate 505. At time t0, the memory controller 140 may send a select signal 605 from a zero voltage level V0 to a higher voltage level. The select signal 605 may be associated with selecting the selected memory cell. The select signal 605 may be associated with the shunting unselected portions of the array during an access operation. The shunting caused by the select signal 605 may be different from the shunting the digit line 115-d with the plate 505 caused by activating shunt switching components 415-a.

At time t0, the memory controller 140 may cause a plate line signal 610 of the plate 505 associated with the selected memory cell to go from zero voltage level V0 to a third voltage level V3 higher than the zero voltage level V0. The third voltage level V3 may be configured to bias the selected memory cell 405-a during an access operation (e.g., a read operation or a write operation).

As the plate 505 rises to the third voltage level V3, coupling between the plate 505 and the digit line 115-d may cause a voltage level of the digit line 1154 to rise, as represented by the digit line signal 615. Between t0 and t1, the digit line 115-d may be coupled to a ground or a virtual ground such that this rise in voltage level may be dissipated. At time t1, the memory controller 140 may isolate the digit line from the ground or the virtual ground. In some instances this is accomplished by activating or deactivating a switching component. In some instances, the time t occur about 10 nanoseconds after t0. For example, the time t1 may range between 6 nanoseconds and 14 nanoseconds, 6.5 nanoseconds and 13.5 nanoseconds, 7 nanoseconds and 13 nanoseconds, 7.5 nanoseconds and 12.5 nanoseconds, 8 nanoseconds and 12 nanoseconds, 8.5 nanoseconds and 11.5 nanoseconds, 9 nanoseconds and 1 nanoseconds, 9.5 nanoseconds and 10.5 nanoseconds, or may be about 10 nanoseconds after time t0.

At time t2, the memory controller 140 may begin developing the signal from the memory cell 405-a. At time t2, the memory controller 140 may activate the selection component 220 by sending a word line signal 620 from the zero voltage level V0 to a higher voltage level. In some examples, the higher voltage level may be greater than the third voltage level V3. By activating the selection component 220, the capacitor 205 of the memory cell 405-a may be coupled to the digit line 115-d.

Depending on the logic state of the selected memory cell 405-a, the voltage level seen on the digit line 115-d may vary. For example, if the selected memory cell 405-a stores a logical '1' as its logic state, the digit line 115-d may raise to a higher voltage level than if the selected memory cell 405-a stores a logical '0'. Digit line signal 616 represents a voltage level of the digit line 115-d when a logical '1' is stored. Digit line signal 617 represents a voltage level of the digit line 1154 when a logical '0' is stored. In some instances, time t2 occurs about 13 nanoseconds after t0. For example, the time t2 may range between 9 nanoseconds and 17 nanoseconds, 9.5 nanoseconds and 16.5 nanoseconds, 10 nanoseconds and 16 nanoseconds, 10.5 nanoseconds and 15.5 nanoseconds, 11 nanoseconds and 15 nanoseconds, 11.5 nanoseconds and 14.5 nanoseconds, 12 nanoseconds and 14 nanoseconds, 12.5 nanoseconds and 13.5 nanoseconds, or may be about 13 nanoseconds after time t0.

At time t3, the memory controller 140 may isolate the selected memory cell from a ground or a virtual ground thereby causing the circuit of the memory cell to float. To accomplish this, the memory controller may activate or deactivate various switching components (not shown). In some instances, time t3 occurs about 25 nanoseconds after t0. For example, the time t3 may range between 21 nanoseconds and 29 nanoseconds, 21.5 nanoseconds and 28.5 nanoseconds, 22 nanoseconds and 28 nanoseconds, 22.5 nanoseconds and 27.5 nanoseconds, 23 nanoseconds and 27 nanoseconds, 23.5 nanoseconds and 26.5 nanoseconds, 24 nanoseconds and 26 nanoseconds, 24.5 nanoseconds and 25.5 nanoseconds, or may be about 25 nanoseconds after time t0.

At time t4, the memory controller 140 may activate the sense component 125 to sense a logic state of the selected memory cell 405-a. To accomplish this, the memory controller 140 may activate or deactivate various switching components (not shown). In addition, at time t4 the memory controller 140 may cause the voltage level of the plate 505 to drop to a second voltage level V2 less than the third voltage level V3, as represented by the plate line signal 610. Using the sense component 125 the memory controller 140 may identify the logic state of the selected memory cell based on the voltage level of the digit line 115-d (e.g., digit line signal 616 for a logical '1' or digit line signal 617 for a logical '0'). For example, the memory controller 140 may compare the digit line voltage level to a reference voltage (e.g., voltage level V1). If the digit line signal 615 is higher than the reference voltage (V1) (e.g., digit line signal 616), the memory controller 140 may identify the logic state as a logical '1.' If the digit line signal 615 is lower than the reference voltage (V1) (e.g., digit line signal 617), the memory controller 140 may identify the logic state as a logical '0.' In some instances, time t4 occurs about 27 nanoseconds after t0. For example, the time t4 may range between 23 nanoseconds and 31 nanoseconds, 23.5 nanoseconds and 30.5 nanoseconds, 24 nanoseconds and 30 nanoseconds, 24.5 nanoseconds and 29.5 nanoseconds, 25 nanoseconds and 29 nanoseconds, 25.5 nanoseconds and 28.5 nanoseconds, 26 nanoseconds and 28 nanoseconds, 26.5 nanoseconds and 27.5 nanoseconds, or may be about 27 nanoseconds after time t0.

At time t5, the memory controller 140 may complete the sensing portion of the read operation and initiate a write back portion of the read operation. In some memory arrays, the act of reading a logic state of a selected memory cell alters the logic state of the selected memory cell. In such situations, a read operation of the selected memory cell may include a write back portion where the sensed logic state is written back to the selected memory cell. At time t5, the memory controller activates or deactivates a number of switching components (not shown). The digit line signals 616, 617 may vary based on these actions. For example, the digit line signal 616 may raise to the second voltage level (V2) with the plate line signal 610. In another example, the digit line signal 617 may drop to the zero voltage level (V0). In some examples, at time t5, the memory controller 140 couples the memory cell 405-a back to a ground or a virtual ground so that the memory cell is no longer floating. In some instances, time t5 occurs about 40 nanoseconds after t0. For example, the time t5 may range between 36 nanoseconds and 44 nanoseconds, 36.5 nanoseconds and 43.5 nanoseconds, 37 nanoseconds and 43 nanoseconds, 37.5 nanoseconds and 42.5 nanoseconds, 38 nanoseconds and 42 nanoseconds, 38.5 nanoseconds and 41.5 nanoseconds, 39 nanoseconds and 41 nanoseconds, 39.5 nanoseconds and 40.5 nanoseconds, or may be about 40 nanoseconds after time t0.

At time t6, the memory controller 140 completes the write back portion of the read operation and initiates a precharge portion of the read operation (e.g., a precharge period). At time t6, the memory controller grounds or virtually grounds the plate 505 such that the plate line signal 610 drops to the zero voltage level (V0). In some instances, time t6 occurs about 60 nanoseconds after to. For example, the time t6 may range between 56 nanoseconds and 64 nanoseconds, 56.5 nanoseconds and 63.5 nanoseconds, 57 nanoseconds and 63 nanoseconds, 57.5 nanoseconds and 62.5 nanoseconds, 58 nanoseconds and 62 nanoseconds, 58.5 nanoseconds and 61.5 nanoseconds, 59 nanoseconds and 61 nanoseconds, 59.5 nanoseconds and 60.5 nanoseconds, or may be about 60 nanoseconds after time t0.

At time t7, the memory controller 140 may ground or virtually ground the digit line 115-d. If the digit line 115-d carries the digit line signal 617 associated with a logical '0,' such an action may not have much effect on the circuit. If the digit line 115-d carries the digit line signal 616 associated with a logical '1,' capacitive coupling between the digit line 115-d and the plate 505 may cause the voltage level of the plate 505 to alter. As is discussed in more detail with reference to FIG. 7, in some examples, this alteration of the voltage level of the plate 505 may disturb the logic states stored on unselected memory cells associated with or coupled to the plate 505. Box 625 represents a portion of the timing diagram that is shown in greater detail in FIG. 7. In some examples, the memory controller 140 deselects the sense component at t7. In some instances, time t7 occurs about 90 nanoseconds after t0. For example, the time t7 may range between 86 nanoseconds and 94 nanoseconds, 86.5 nanoseconds and 93.5 nanoseconds, 87 nanoseconds and 93 nanoseconds, 87.5 nanoseconds and 92.5 nanoseconds, 88 nanoseconds and 92 nanoseconds, 88.5 nanoseconds and 91.5 nanoseconds, 89 nanoseconds and 91 nanoseconds, 89.5 nanoseconds and 90.5 nanoseconds, or may be about 90 nanoseconds after time t0.

Also at t7, the memory controller 140 may couple the plate 505 to the digit line 115-d using a shunt switching component. At time t7, the memory controller 140 may bias the first shunt control line 535 and/or and the second shunt control line 540 using a signal 630. In some examples, the signal 630 may be configured to activate the shunt switching components 415-a based on instructions from the memory controller 140. The signal 630 may be carried by one of the shunt control lines (e.g., control lines 420, 460, 465, 535, 540). The shunt switching components 415-a may be configured such that when the signal 630 goes high, the shunt switching components 415-a are activated and a respective plate 505 is coupled to a respective digit line 115-d. The signal 630 may rise from a voltage level below the gate voltage threshold of the shunt switching components 415-a (e.g., the zero voltage level (V0)) to some non-zero voltage level above the gate voltage threshold of the shunt switching components 415-a (e.g., the first voltage level (V1), the second voltage level (V2), the third voltage level (V3), or some other voltage level). Upon sending the signal 630 high, the shunt switching components 415-a may be activated, thereby coupling the digit lines 115-d to the plates 505-b. In some examples, the memory controller 140 may isolate the plate 505 from the digit line 115-d by sending the signal 630 back below the gate threshold voltage of the shunt switching components 415-a (e.g., the zero voltage level (V0)).

At time t8, the memory controller 140 completes the access operation. At time t8, the memory controller 140 may isolate the capacitor of the memory cell 405-a from the digit line 115-d by deactivating the selection component 220. The memory controller 140 may accomplish this by causing the word line signal 620 to drop to the zero voltage level (V0). The memory controller 140 may also deselect the selected memory cell 405-a. The memory controller 140 may isolate the plate 505 from the digit line 115-d by deactivating the shunt switching components. The memory controller 140 may accomplish this by causing the select signal 605 to drop to the zero voltage level (V0). In some instances, time t8 occurs about 100 nanoseconds after t0. For example, the time t8 may range between 96 nanoseconds and 104 nanoseconds, 96.5 nanoseconds and 103.5 nanoseconds, 97 nanoseconds and 103 nanoseconds, 97.5 nanoseconds and 102.5 nanoseconds, 98 nanoseconds and 102 nanoseconds, 98.5 nanoseconds and 101.5 nanoseconds, 99 nanoseconds and 101 nanoseconds, 99.5 nanoseconds and 100.5 nanoseconds, or may be about 100 nanoseconds after time t0.

Figure 7:
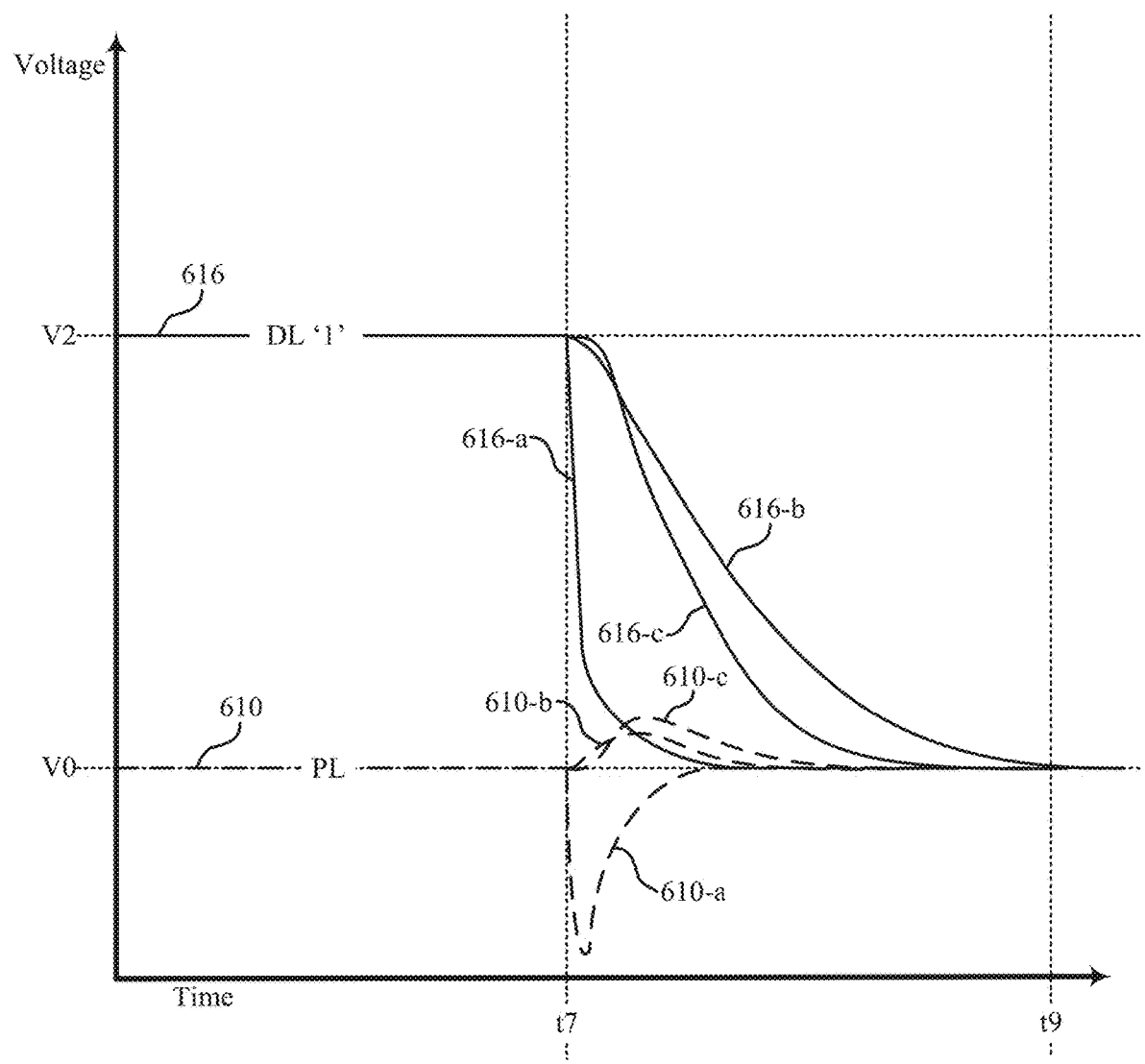
FIG. 7 illustrates an example of a timing diagram that supports techniques to mitigate disturbances of memory cells in accordance with embodiments of the present disclosure.

FIG. 7 illustrates an example of a timing diagram 700 that supports techniques to mitigate disturbances of memory cells in accordance with various embodiments of the present disclosure. The timing diagram 700 is a more detailed diagram of a portion of the timing diagram 600 indicated by the box 625.

The timing diagram 700 includes a representation of the voltage level of the plate 505, as represented by the plate line signal 610 and a representation of the voltage level of the digit line 115-d, as represented by the digit line signal 616. The timing diagram 700 depicts three variations of responses that may occur in a memory array based on the architecture of the circuits of the memory array. The digit line signal 616-a and the plate line signal 610-a represent voltage responses in a memory array that does not include a shunt line between the plate 505 and the digit line 115-d (e.g., the memory array shown and depicted in FIGS. 1 and 2). The digit line signal 616-b and the plate line signal 610-b represent voltage responses in a memory array that includes the first configuration 401 of a shunt line described with reference to FIGS. 4 and 5. The digit line signal 616-c and the plate line signal 610-c represent voltage responses in a memory array that includes the second configuration 402 of a shunt line described with reference to FIG. 4.

During an access operation of a selected memory cell, the plate 505 may become coupled, sometimes capacitively, to a digit line 115-d. When such coupling occurs changes in the voltage level of one component (e.g., digit line 115-d or plate 505) may result in changes in the voltage level of the other component (e.g., digit line 115-d or plate 505). The changes in the voltage level of the other component may be undesirable and may modify logic states of unselected memory cells associated with the other component. For example, when the plate 505 is at or near the zero voltage level V0 and the digit line 115-d moves from a second voltage level V2 to the zero voltage level V0, such movement may induce a negative voltage on the plate 505 as represented by plate line signal 610-a.

More specifically, at time t7, the memory controller 140 may ground or virtually ground the digit line 115-d. When that occurs, the digit line 115-d moves from the second voltage level V2 to a zero voltage level V0, as represented by digit line signal 616-a. Because the plate 505 is already at the zero voltage level V0, transient voltages are induced on the plate 505, as represented by the negative voltage seen on plate line signal 610-a. Such transients may disturb the logic states of unselected memory cells coupled to the plate 505.

To address these unwanted transient voltages, a memory array may include the first configuration 401 of a shunt or the second configuration 402 of a shunt. As represented by the plate line signal 610-b, by coupling the plate 505 to the digit line 115-d via a single shunt switching component 415-a the magnitude of the transient voltages may be reduced. In some examples, positive transient voltages result in fewer disturbances on unselected memory cells. As represented by the digit line signal 616-b, the shunt coupling may increase the amount of time the digit line 115-d takes to fall from the second voltage level V2 to the zero voltage level V0. In some examples, the digit line 115-d may not fully transition to the zero voltage state V0 until time t9. The increase transition time for the digit line 115-d may increase the amount of time needed for an access operation, in some examples. In some instances, time t9 occurs about 30 nanoseconds after t7. For example, the time t9 may range between 28.5 nanoseconds and 31.5 nanoseconds, 29 nanoseconds and 31 nanoseconds, 29.5 nanoseconds and 30.5 nanoseconds, or may be about 30 nanoseconds.

As represented by the plate line signal 610-c, by coupling the plate 505 to the digit line 115-d via two shunt switching components 450, 455 in parallel the magnitude of the transient voltages may be reduced. In some examples, positive transient voltages result in fewer disturbances on unselected memory cells. As represented by the digit line signal 616-c, the shunt coupling may increase the amount of time the digit line 115-d takes to fall from the second voltage level V2 to the zero voltage level V0. The transition time of the digit line 115-d using the second configuration 402 may be less than the transition time of the digit line 115-d using the first configuration 401. In some examples, there is a trade-off between the transition time of the digit line 115-d and a magnitude and/or type of the transient voltages induced on the plate 505.

The timing diagram 700 only illustrates one example of unwanted transient voltages being induced on a component due to capacitive coupling. In other examples, changes in the voltage level of the plate 505 may induce transient voltages on the digit line 115-d.

Figure 8:
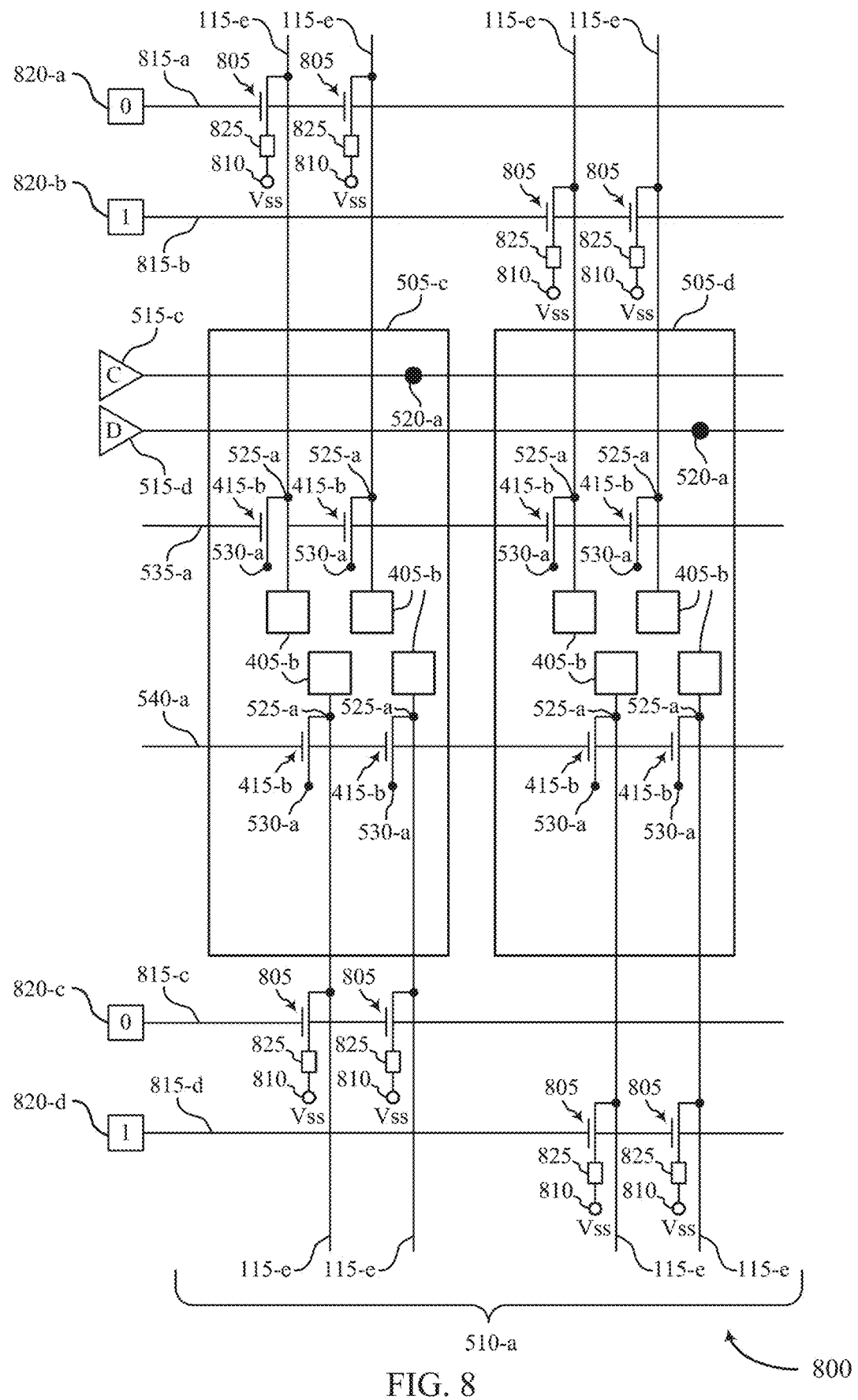
FIG. 8 illustrates an example of a memory array that supports techniques to mitigate disturbances of memory cells in accordance with embodiments of the present disclosure.

FIG. 8 illustrates an example of a memory array 800 that supports techniques to mitigate disturbances of memory cells in accordance with various embodiments of the present disclosure. The memory array 800 may include circuitry configured to control a rate of discharge of a digit line signal using a stepped gate voltage. Such a controlled discharge may also be configured to mitigate unwanted transient voltages on a component that is capacitively coupled to another component (e.g., the plate and the digit line).

As shown in FIG. 7, in the illustrative example, a tradeoff may exist between a transition time of the digit line 115-e and magnitude and type of a transient voltage induced on a plate 505 by the digit line 115-c. The increase in transition time of the digit line 115-c may increase the total time of an access operation. Such an increase in the duration of an access operation may be undesirable. In some examples, the memory array 800 may be configured to reduce the transition time, as compared to the operation of the memory array 500 described with reference to FIG. 5.

The memory array 800 is similarly embodied as the memory array 500. As such, descriptions of components and features that the memory array 800 shares with the memory array 500 are not repeated here. The memory array 800 may include a number of plates 505-c through 505-d organized into plate groups 510-a and associated plate drivers 515-c through 515-d. For clarity purposes, the memory array 800 only illustrates two plates 505 and one plate group 510-a, but it should be appreciated that the memory array 800 may include any number of plates 505-N, plate groups 510-N, or plate drivers 515-N. The memory array 800 also includes memory cell 405-b coupled to their respective plates 505 and shunt switching components 415-b to selectively couple the digit line 115-c to the plate 505.

The memory array 800 may also include a plurality of digit line shunt switching components 805 to selectively couple the digit line 115-e to a virtual ground 810 (Vss). In some examples, the virtual ground 810 may be any voltage source. In some examples, the virtual ground 810 may be ground. The digit line shunt switching components 805 may be similarly embodied as the shunt switching components 415, 450, 455 and/or the selection component 220.

The memory array 800 may also include a plurality of digit line shunt control lines 815 coupled to the gates of the digit line shunt switching components 805. The digit line shunt control lines 815 may be configured to carry instructions from a memory controller 140 that activate or deactivate the digit line shunt switching components 805. For example, when the digit line shunt switching components 805 are activated, the digit line 115-e may be coupled to the virtual ground 810.

Each of the plurality of digit line shunt control lines 815 may be coupled to a subset of digit line shunt switching components 805. For example, a first digit line shunt control line 815-a may be coupled to a first subset of digit line shunt switching components 805 associated with the first plate 505-c and a third digit line shunt control line 815-c may be coupled to a second subset of digit line shunt switching components 805 associated with the first plate 505-c. Similarly, the second digit line shunt control line 815-b and the fourth digit line shunt control line 815-d may be coupled to digit line shunt switching components 805 associated with the second plate 505-d.

Each digit line shunt control line 815 may be coupled to a command line 820 of the memory controller 140. For example, a first command line 820-a may be coupled to the first and third digit line shunt control lines 815. As such, the instructions or gate voltages carried by the first and digit line shunt control lines 815 may be identical because the commands come from the same source. Similarly, a second command line 820-b may be coupled to the second and fourth digit line shunt control lines 815.

In some examples, two digit line shunt control lines 815 are associated with a single plate 505. In other examples, any number of digit line shunt control lines 815 are associated with a single plate 505. In some examples, each plate 505 is associated with a single command line 820. In other examples, a plate 505 may be associated with any number of command lines 820. In such examples, digit line shunt switching components 805 coupled to a plate 505 may be controlled independently based on what command line 820 they are associated with. In some examples, a digit line shunt control line 815 and its command line 820 may be associated with multiple plates in a plate group 510. For example, the first digit line shunt control line 815-a and the first command line 820-a may be associated with a first plate 505-c, a fifth plate 505-g, a ninth plate 505-k, etc., while the second digit line shunt control line 815-b and the second command line 820-b may be associated with a second plate 505-d, a sixth plate 505-h, a tenth plate 505-l, etc. In some examples, a plate group 510-a may have any number of command lines 820 associated with it (e.g., four command lines 820 coupled to eight digit line shunt control lines 815).

To control the discharge of the digit line, the memory controller 140 may step the gate voltage of the digit line shunt switching components 805. By applying a first voltage level for an intermediate time and then applying a second voltage level (higher than the first voltage level), the rate of discharge of the digit line 115-e may be slowed. For example, see the timing diagrams 900 described with reference to FIG. 9.

Optionally, a current generator 825 may be positioned between the digit line shunt switching component 805 and the virtual ground 810. The current generator 825 may be configured to control the discharge of the digit line 115-c to the virtual ground 810. In some examples, the current generator 825 may cause the digit line 115-e to discharge more slowly than when the current generator 825 is absent. In some examples, the current generator 825 may be used in conjunction with a stepped voltage command. In some examples, the current generator 825 may be used independent from the stepped voltage command.

Figure 9:
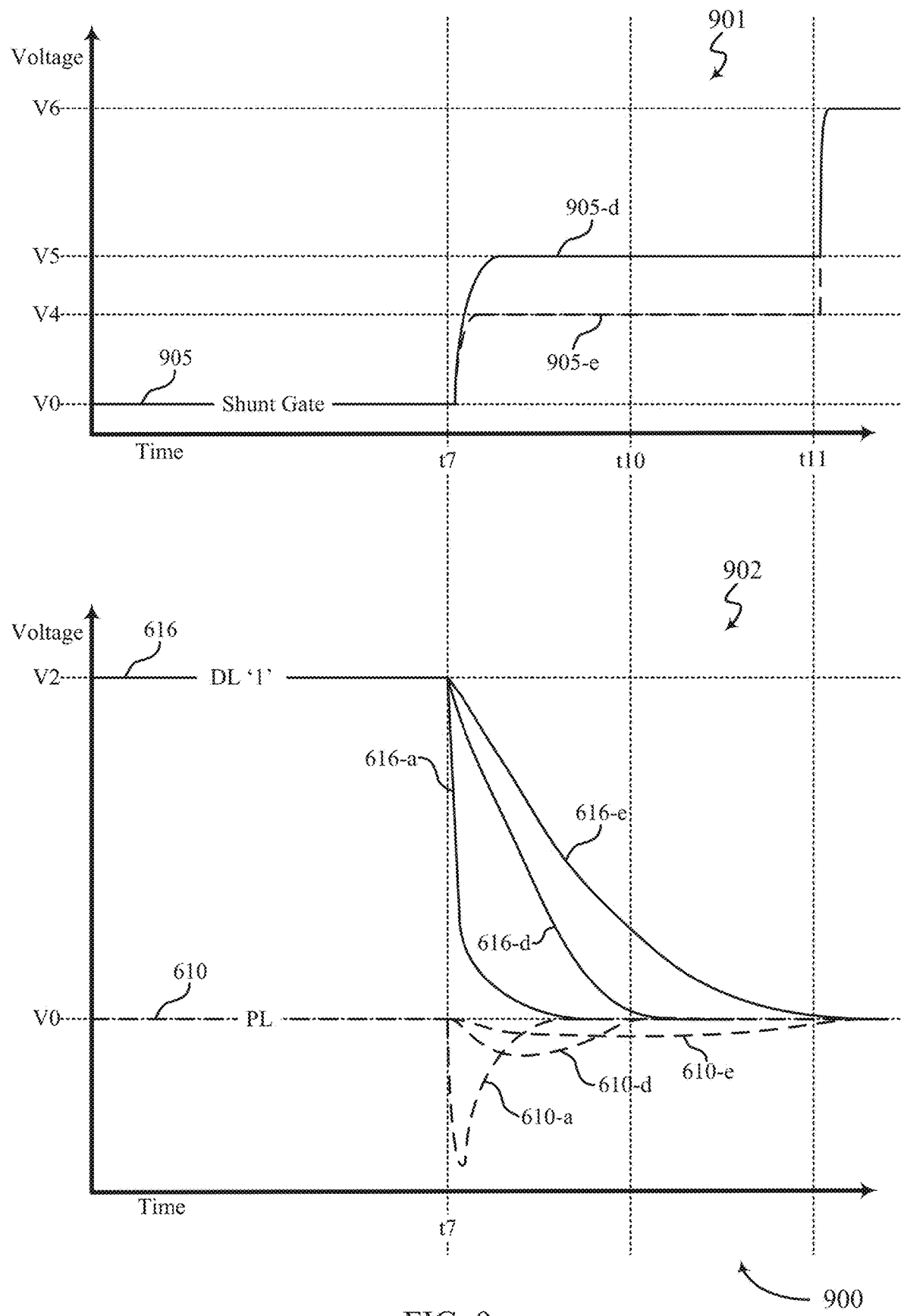
FIG. 9 illustrates an example of timing diagrams that support techniques to mitigate disturbances of memory cells in accordance with embodiments of the present disclosure.

FIG. 9 illustrates an example of timing diagrams 900 that support techniques to mitigate disturbances of memory cells in accordance with various embodiments of the present disclosure. The timing diagrams 900 may include a first timing diagram 901 and a second timing diagram 902. The first timing diagram 901 illustrates the gate voltages of the digit line shunt switching components 805-a during a controlled discharge that involves stepping the gate voltages. The second timing diagram 902 illustrates the responses in the memory array 800 based on the controlled discharge using the stepped gate voltages. Both the first timing diagram 901 and the second timing diagram 902 may correspond to the time of an access operation represented by the box 625 as described with reference to FIG. 6.

The first timing diagram 901 illustrates the voltage level of a gate of a digit line shunt switching component 805-a during an access operation, as represented by the shunt gate signal 905. The shunt gate signal 905 may be communicated to the gates of the digit line shunt switching components 805-a via the digit line shunt control lines 815-a. The first timing diagram 901 shows two different procedures for stepping the gate voltages of the digit line shunt switching components 805-a. A first shunt gate signal 905-d shows a voltage level of the digit line shunt control line 815-a during a first stepped voltage procedure. A second shunt gate signal 905-e shows a voltage level of the digit line shunt control line 815-a during a second stepped voltage procedure different from the first stepped voltage procedure.

As discussed previously, at time t7, the memory controller 140 may couple a digit line 115-e to ground or virtual ground. The digit line signal 616-a and the plate line signal 610-a may represent responses of a memory array when no shunt components are present. Both the first shunt gate signal 905-d and the second shunt gate signal 905-e represent operations to step the gate voltages of the digit line shunt switching components 805-a and thereby control how the digit line is discharged via the virtual ground 810.

In the operation represented by the first shunt gate signal 905-d, the memory controller 140 at time t7 adjusts the shunt gate voltage to a fifth voltage level V5 from the zero voltage level V0 for a duration (e.g. until t11). In some instances, the fifth voltage level V5 may range between 1.7 volts and 2.3 volts, 1.8 volts and 2.2 volts, 1.9 volts and 2.1 volts, or may be about 2 volts. In some instances, time t11 may occur about 20 nanoseconds after time t7. For example, the time t11 may range between 16 nanoseconds and 24 nanoseconds, 16.5 nanoseconds and 23.5 nanoseconds, 17 nanoseconds and 23 nanoseconds, 17.5 nanoseconds and 22.5 nanoseconds, 18 nanoseconds and 22 nanoseconds, 18.5 nanoseconds and 21.5 nanoseconds, 19 nanoseconds and 21 nanoseconds, 19.5 nanoseconds and 20.5 nanoseconds, or may be about 20 nanoseconds after time t7.

In the operation represented by the second shunt gate signal 905-e, the memory controller 140 at time t7 adjusts the shunt gate voltage to a fourth voltage level V4 from the zero voltage level V0 for a duration (e.g. until t11). The fourth voltage level V4 being less than the fifth voltage level V5. As is shown by digit line signals 616-d, 616-c and plate line signals 610-d and 610-e, the first stepped voltage operation may result in different responses from the second stepped voltage operation.

As shown in the second timing diagram 902, the second stepped voltage operation (represented by second shunt gate signal 905-c) may cause the digit line 115-c to go from the second voltage level V2 to the zero voltage level V0. The duration of such a transition may be about 20 nanoseconds, or between about time t7 and time t11. As shown by the plate line signal 610-e, the negative transient voltages induced on the plate 505 by the transition of the digit line 115-c may be reduced in magnitude by the second stepped voltage operation.

The first stepped voltage operation (represented by first shunt gate signal 905-d) may cause the digit line 115-c to go from the second voltage level V2 to the zero voltage level V0. The duration of such a transition may be about 10 nanoseconds, or between about time t7 and time t10. For example, the time t10 may range between 3 nanoseconds and 17 nanoseconds, 3.5 nanoseconds and 16.5 nanoseconds, 4 nanoseconds and 16 nanoseconds, 4.5 nanoseconds and 15.5 nanoseconds, 5 nanoseconds and 15 nanoseconds, 5.5 nanoseconds and 14.5 nanoseconds, 6 nanoseconds and 14 nanoseconds, 6.5 nanoseconds and 13.5 nanoseconds, 7 nanoseconds and 13 nanoseconds, 7.5 nanoseconds and 12.5 nanoseconds, 8 nanoseconds and 12 nanoseconds, 8.5 nanoseconds and 11.5 nanoseconds, 9 nanoseconds and 11 nanoseconds, 9.5 nanoseconds and 10.5 nanoseconds, or may be about 10 nanoseconds after time t7. As shown by the plate line signal 610-d, the negative transient voltages induced on the plate 505 by the transition of the digit line 115-e may be reduced in magnitude by the first stepped voltage operation. In some examples, there is a relationship between the intermediate voltage level (voltage V4 or voltage V5) and the magnitude of the voltages induced on the plate 505. In some examples, there is a relationship between the intermediate voltage level (voltage V4 or voltage V5) and the transition time of the digit line 115-c. Thus, there may be a relationship between the transition time of the digit line 115-c and the voltages induced on the plate 505.

In some examples, the one of the stepped voltage operations may be used in conjunction with one of the first configuration 401 or the second configuration 402. In such examples, the overall transition time of the digit line 115-e may be reduced as compared to the transition time needed when only the shunt switching components 415, 450, 455 are present. In addition, such examples may also mitigate the voltages induced on the plate 505. It should be appreciated the plate 505 may, in some examples, induce voltages on the digit line 115-e or another coupled component. As such, the principles discussed herein may be applied to any circuit that has a component inducing voltages on another component.

Figure 10:
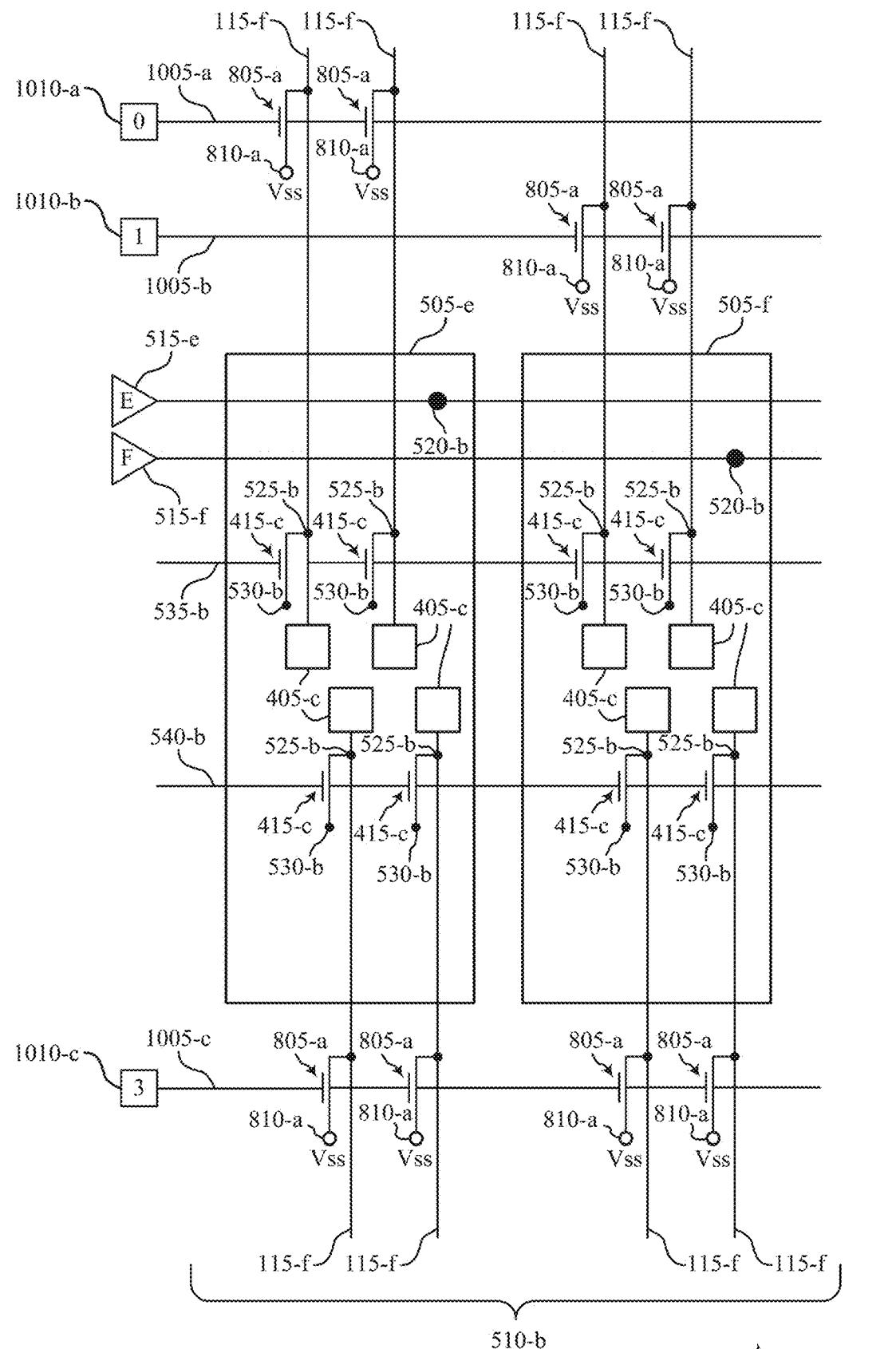
FIG. 10 illustrates an example of a memory array that supports techniques to mitigate disturbances of memory cells in accordance with embodiments of the present disclosure.

FIG. 10 illustrates an example of a memory array 1000 that supports techniques to mitigate disturbances of memory cells in accordance with various embodiments of the present disclosure. The memory array 1000 may be include circuitry configured to control a rate of discharge of a digit line signal using a ramped analog gate voltage. Such a controlled discharge may also be configured to mitigate unwanted transient voltages on a component that is capacitively coupled to another component (e.g., the plate and the digit line).

In some examples, the rate that the digit line 115-f is discharged via the virtual ground 810-a may be modified by applying an analog gate voltage to the digit line shunt switching components 805-a. The analog gate voltage may include ramping up the gate voltage from the zero voltage level to the fifth voltage level V5. In some examples, the ramping up of the analog gate voltage may be a linear ramping up of the gate voltage. The voltage levels of the digit line 115-f may take a duration to transition from the second voltage level V2 to the zero voltage level V0. The duration may be longer than if no ramping analog gate voltage is applied.

The memory array 1000 may be similarly embodied as the memory array 800 described with reference to FIG. 8.

However, some embodiments of the memory array 1000 may be different than the memory array 800. For example, in the memory array 1000 may include three different digit line shunt control lines 1005. In some instances, the memory array 1000 may include three different command lines 1010 coupled to the three different digit line shunt control lines 1005. The shunt control lines 1005 may be examples of the digit line shunt control lines 815 described with reference to FIG. 8. The command lines 1010 may be examples of the command lines 820 described with reference to FIG. 8.

In some examples, the number of command lines 1010 may be different than three (e.g., one, two, four, or five). In some examples, the number of control lines 1005 may be different than three (e.g., one, two, four, or five). As shown in the memory array 1000, two control lines 1005-*a*. 1010-*b* may be associated with different plates 505-*e* and 505-*f*, while a third digit line shunt control line 1005-*c* may be associated with all of the plates 505 in a plate group 510-*b*. In some examples, each of the three control lines 1005 in the memory array 1000 may be associated with a different configuration of shunt switching components. In some examples, the memory array 1000 may include current generators positioned between the digit line 115-*f* and the virtual ground 810-*a*.

Figure 11:
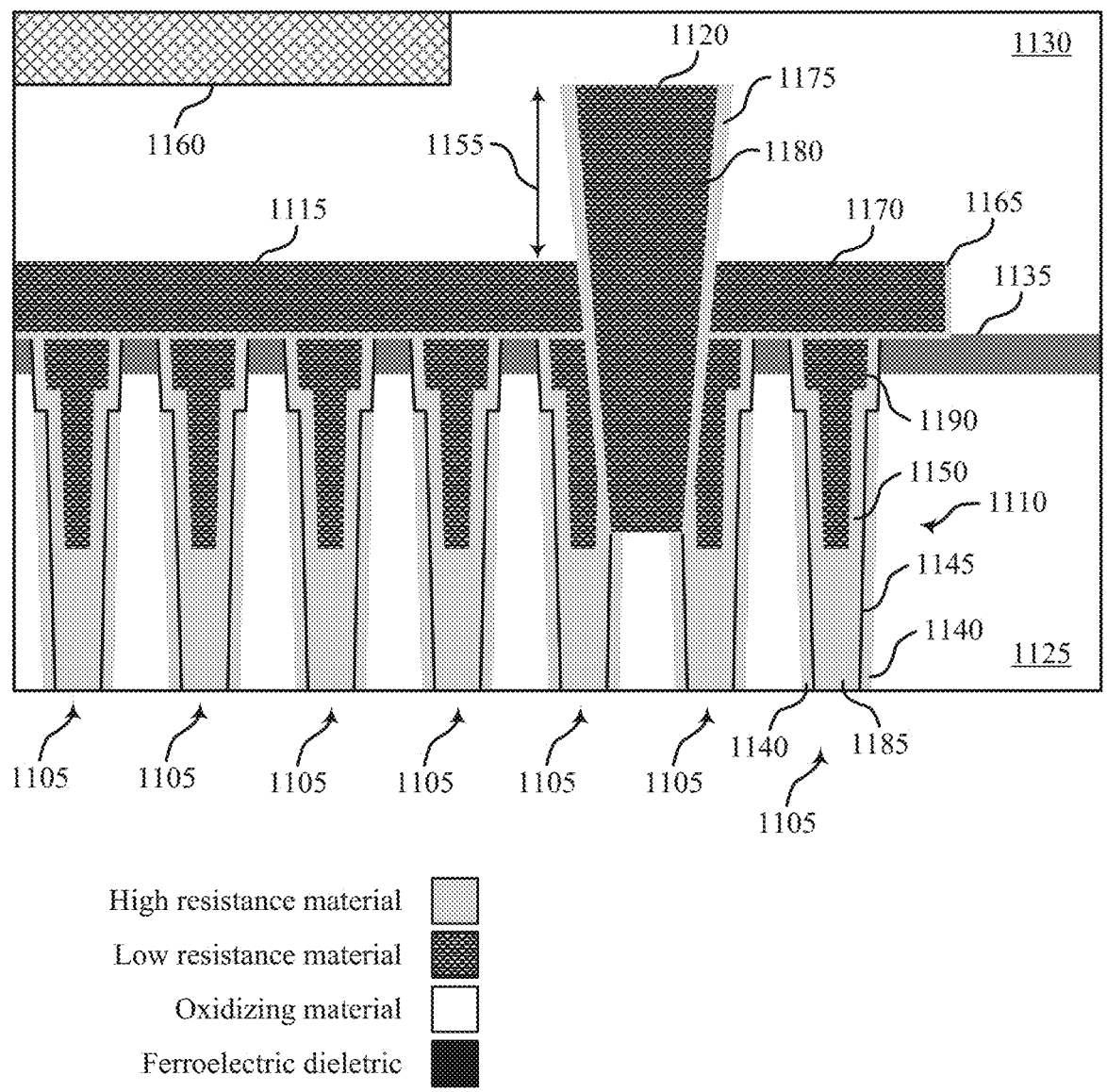
FIG. 11 shows a diagram of a memory array that supports techniques to mitigate disturbances of memory cells in accordance with embodiments of the present disclosure.

FIG. 11 illustrates an example of a memory array 1100 that supports techniques to mitigate disturbances of memory cells in accordance with various embodiments of the present disclosure. FIG. 11 illustrates a cross-section view of the memory array 1100. The memory array 1100 may include ferroelectric memory cells 1105 formed into an array 1110, a plate 1115, and a contact 1120 that couples the digit line (not shown) to the plate 1115. How the coupling may be accomplished is described in more detail below. The memory array 1100 may be an example of the memory arrays 100, 500, 800, 1000 described with reference to FIGS. 1, 5, 8, and 10.

The memory array 1100 may be formed of a number of different materials. For example, a first dielectric material 1125 (sometimes referred to as an oxidizing material or an insulating material) may be surrounding the memory cells 1105 and a second dielectric material 1130 may be positioned above the first dielectric material. An intermediate material 1135 may be positioned between the first dielectric material 1125 and the second dielectric material 1130.

The memory cells 1105 may include a bottom electrode 1140, a ferroelectric material 1145, and a top electrode 1150. The bottom electrode 1140 may be formed of a high-resistance material, as represented by the light gray. In some examples, the high-resistance material may be titanium nitride (TiN). The bottom electrode 1140 may be coupled to a digit line (not shown) of the memory cell 1105. The top electrode 1150 may be formed of the high-resistance material and a low-resistance material, as represented by darker sections. In some examples, the low-resistance material may be tungsten (W). The ferroelectric material 1145 may be positioned between the bottom electrode 1140 and the top electrode 1150.

The plate 1115 may be formed of both the high-resistance material (e.g., TiN) and the low-resistance material (e.g., W). For example, a first layer 1165 of the plate 1115 may be formed of the high-resistance material. The first layer 1165 contacting at least the top electrode 1150 of the memory cell 1105. A second layer 1170 of the plate 1115 may be formed of the low-resistance material. The low-resistance material may be used as fill in some situations.

The contact 120 may be formed of both the high-resistance material (e.g., TiN) and the low-resistance material (e.g., W). In some examples, a sheath 1175 of high-resistance material may surround a core 1180 of low-resistance material in the contact. The contact 1120 may be positioned and configured to couple the bottom electrode 1140 of one or more memory cells 1105 to the plate 1115.

The contact 1120 may define a height 1155 above a surface of the plate 1115. The contact 1120 may be positioned at an edge of the array 1110. In this manner, a metal layer 1160 may not couple to the contact 1120. The metal layer 1160 being about the same distance away from the surface of the plate 1115 as the top of the contact 1120. In some examples, if the metal layer 1160 touches the contact 1120, unwanted electrical effects may occur.

A method of manufacture of the contact 1120 is described in relation to FIG. 11. In some examples, the array 1110 of memory cells 1105 may be formed, each memory cell 1105 comprising the bottom electrode 1140, the ferroelectric material 1145, and the top electrode 1150. Such a forming may be done by forming (e.g., depositing), patterning (e.g., photo-lithographically patterning), and removing (e.g., selectively etching) different materials. For example, the first dielectric material 1125 may deposited onto a substrate, the substrate having a number of different components including a contact for a digit line. A plurality of containers may be etched into the first dielectric material 1125. The high-resistance material may be deposited into the container to form the bottom electrode 1140. In some examples, at least a portion of the high-resistance material may be etched. The ferroelectric material 1145 may be deposited into the container onto the bottom electrode 1140. In some examples, at least a portion of the ferroelectric material 1145 may be etched. The high-resistance material may be deposited into the container onto the ferroelectric material 1145 to form a portion 1185 of the top electrode 1150. In some examples, at least a portion of the high-resistance material may be etched. The low-resistance material may be deposited into the container onto the high-resistance material of the top electrode 1150 to form another portion 1190 of the top electrode 1150. In some examples, the memory cell 1105 may be etched or planarized to form a top planar surface. In some cases, a dielectric material may be used in place of the ferroelectric material.

A plate 1115 may be formed on top of the planarized surface of the memory cells 1105. The plate 1115 may be coupled to the array 1110 of memory cells 1105. The plate 1115 may be formed by depositing high-resistance material to the planarized surface to form the first layer 1165 of the plate 1115. In some examples, at least a portion of the high-resistance material may be etched. Low-resistance material may be deposited into an area of the high-resistance material that was etched away to form the second layer 1170 of the plate 1115. In some examples, the high-resistance material may be an example of a liner or a barrier material. In such examples, the high-resistance material may conform to contours of the underlying surface and a low-resistance material may be deposited onto certain areas of the conforming high-resistance material. In some examples, the plate 1115 may be planarized. The second dielectric material 1130 may be formed by depositing dielectric material on top of the array 1110 and the plate 1115.

To form the contact 1120 a number of steps may be performed. A container may be etched into the memory array 1100. The etched container may be positioned on the memory array 1100 to be between two memory cells 1105. When etching the memory array 1100 to form the container, portions of second dielectric material 1130, portions of the plate 1115, portions of one or more memory cells 1105, and/or portions of the first dielectric material 1125 may be removed. For example, portions the top electrode 1150, the ferroelectric material 1145, and the bottom electrode 1140 of a memory cell 1105 may be removed. The container may extend a certain depth into memory array 1100. The bottom of the container may expose portion of a bottom electrode 1140 of a memory cell 1105. The high-resistance material may be deposited into the container to form a first portion (i.e., sheath 1175) of the contact 1120. In some examples, at least a portion of the high-resistance material may be etched. Low-resistance material may be deposited into an area of the high-resistance material that was etched away to form a second portion (i.e., core 1180) of the contact 1120. In some examples, the high-resistance material may be an example of a liner or a barrier material. In such examples, the high-resistance material may conform to contours of the underlying surface and a low-resistance material may be deposited onto certain areas of the conforming high-resistance material to form a second portion (i.e., core 1180) of the contact 1120. The contact 1120 may couple the plate 1115 to a digit line (not shown) by contacting the plate 1115 and a bottom electrode 1140 of a memory cell 1105.

The method of manufacturing may be accomplished without generating any additional steps in the process. For example, etching and depositing the materials to form the contact 1120 may leverage existing etching and depositing steps. In such examples, the controller for the method of manufacture may alter the area to which a pre-existing etching step or a pre-existing depositing step is applied to form the contact 1120. In some examples, forming the contact 1120 involves new processing steps.

Figure 12:
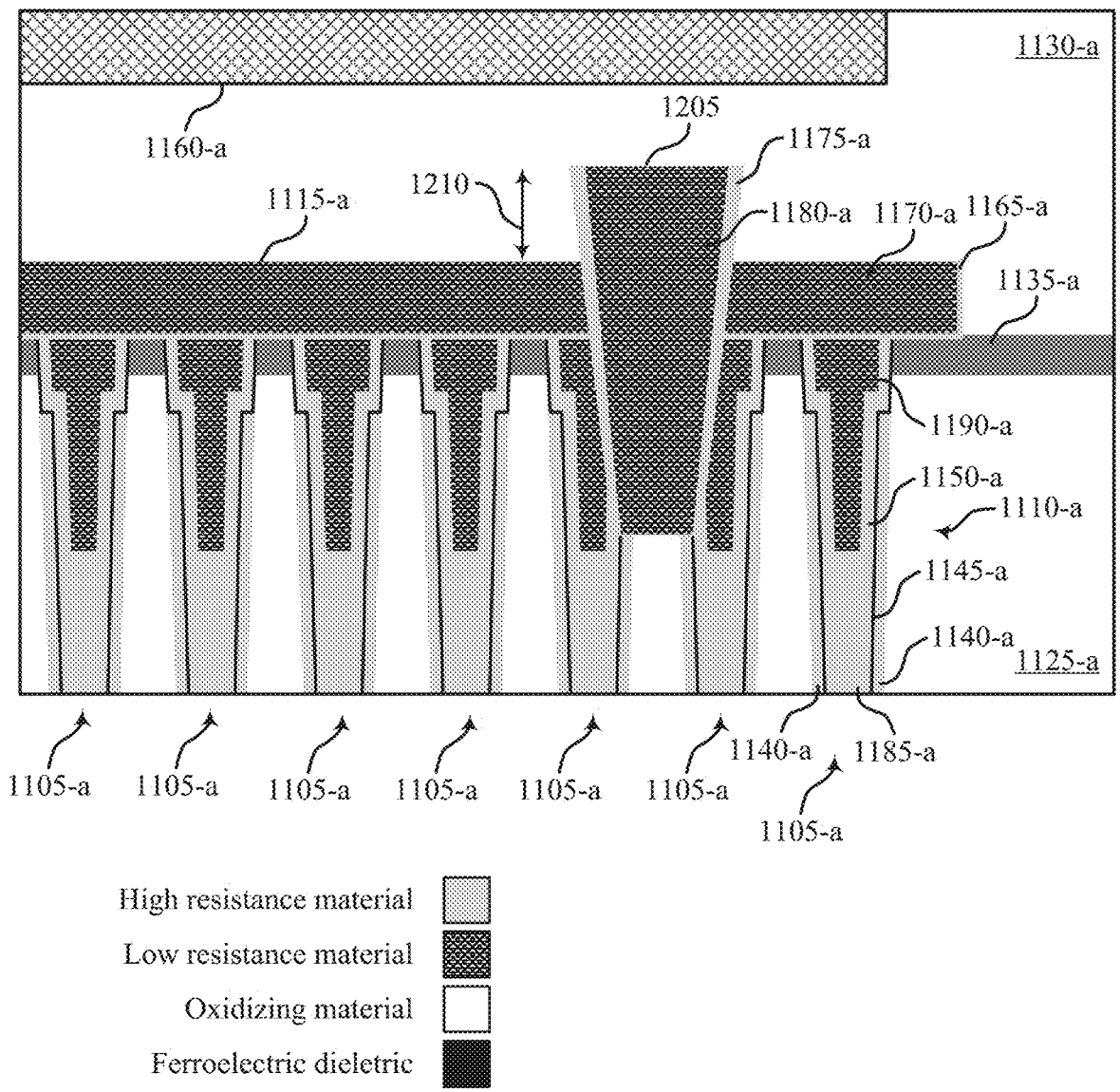
FIG. 12 shows a diagram of a memory array that supports techniques to mitigate disturbances of memory cells in accordance with embodiments of the present disclosure.

FIG. 12 illustrates an example of a memory array 1200 that supports techniques to mitigate disturbances of memory cells in accordance with various embodiments of the present disclosure. FIG. 12 illustrates a cross-section view of the memory array 1200. The memory array 1200 may be an example of the memory array 1100 described with relation to FIG. 11. As such, not all features are described in full here. The memory array 1200 may be an example of the memory arrays 100, 500, 800, 1000 described with reference to FIGS. 1, 5, 8, and 10.

The memory array 1200 illustrates an example of a memory array where a contact 1205 is positioned below the metal layer 1160-*a*. The contact 1205 may be an example of the contact 1120-*a* described with reference to FIG. 11. A difference between the contact 1205 and the contact 1120-*a* may be the heights of the respective contacts. For example, the contact 1205 may define a height 1210 above a surface of the plate 1115-*a* that is less than the height 1155-*a* of the contact 1120-*a*.

To accommodate this difference in height, the step of depositing the second dielectric material 1130-*a* may be modified. For example, a first portion of the second dielectric material 1130-*a* may be deposited prior to etching a container to form the contact 1205 and a second portion of the second dielectric material 1130-*a* may be deposited after forming the contact 1205.

Figure 13:
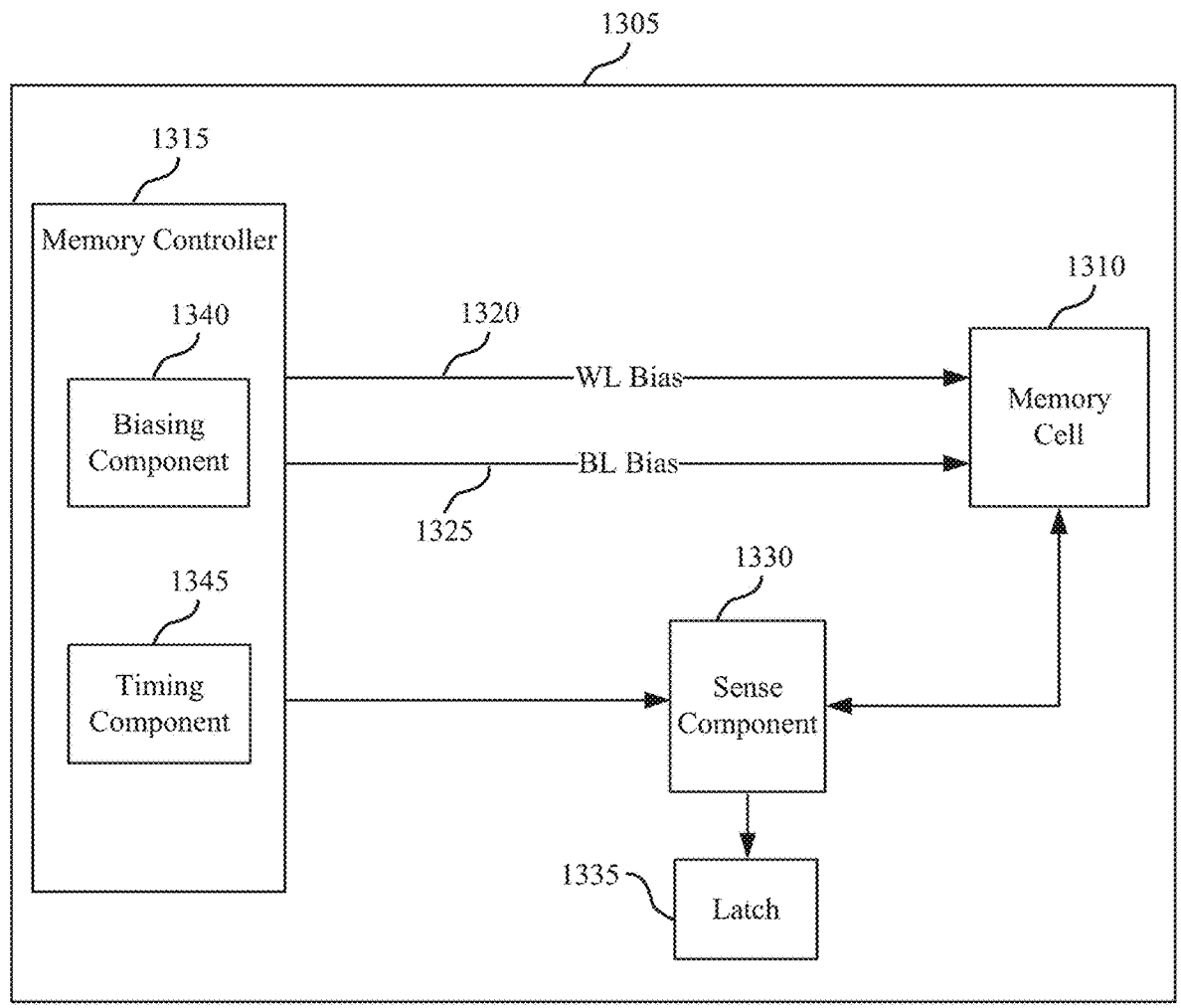
FIGS. 13 through 14 show block diagrams of a device that support techniques to mitigate disturbances of memory cells in accordance with embodiments of the present disclosure.

FIG. 13 shows a block diagram 1300 of a memory array 1305 that supports techniques to mitigate disturbances of memory cells in accordance with various embodiments of the present disclosure. Memory array 1305 may be referred to as an electronic memory apparatus.

Memory array 1305 may include one or more memory cells 1310, a memory controller 1315, a word line 1320, a plate line 1325, a reference component 1330, a sense component 1335, a digit line 1340, and a latch 1345. These components may be in electronic communication with each other and may perform one or more of the functions described herein. In some cases, memory controller 1315 may include biasing component 1350, timing component 1355, and shunt manager 1360.

Memory controller 1315 may be in electronic communication with word line 1320, digit line 1340, sense component 1335, and plate line 1325, which may be examples of word line 110, digit line 115, sense component 125, and plate line 210 described with reference to FIGS. 1, and 2. Memory array 1305 may also include reference component 1330 and latch 1345. The components of memory array 1305 may be in electronic communication with each other and may perform embodiments of the functions described with reference to FIGS. 1 through 12. In some cases, reference component 1330, sense component 1335, and latch 1345 may be components of memory controller 1315. The memory controller 1315 may be an example of the memory controller 140 as described with reference to FIG. 1.

In some examples, digit line 1340 is in electronic communication with sense component 1335 and a ferroelectric capacitor of ferroelectric memory cells 1310. A ferroelectric memory cell 1310 may be writable with a logic state (e.g., a first or second logic state). Word line 1320 may be in electronic communication with memory controller 1315 and a selection component of ferroelectric memory cell 1310. Plate line 1325 may be in electronic communication with memory controller 1315 and a plate of the ferroelectric capacitor of ferroelectric memory cell 1310. Sense component 1335 may be in electronic communication with memory controller 1315, digit line 1340, latch 1345, and reference line 1365. Reference component 1330 may be in electronic communication with memory controller 1315 and reference line 1365. Sense control line 1370 may be in electronic communication with sense component 1335 and memory controller 1315. These components may also be in electronic communication with other components, both inside and outside of memory array 1305, in addition to components not listed above, via other components, connections, or busses.

Memory controller 1315 may be configured to activate the word line 1320, plate line 1325, or digit line 1340 by applying voltages to those various nodes. For example, biasing component 1350 may be configured to apply a voltage to operate the memory cell 1310 to read or write memory cell 1310 as described above. In some cases, memory controller 1315 may include a row decoder, column decoder, or both, as described with reference to FIG. 1. This may enable the memory controller 1315 to access one or more memory cells 105. Biasing component 1350 may also provide voltage potentials to reference component 1330 in order to generate a reference signal for sense component 1335. Additionally, biasing component 1350 may provide voltage potentials for the operation of sense component 1335.

In some cases, memory controller 1315 may perform its operations using timing component 1355. For example, timing component 1355 may control the timing of the various word line selections or plate biasing, including timing for switching and voltage application to perform the memory functions, such as reading and writing, discussed herein. In some cases, timing component 1355 may control the operations of biasing component 1350.

Reference component 1330 may include various components to generate a reference signal for sense component 1335. Reference component 1330 may include circuitry configured to produce a reference signal. In some cases, reference component 1330 may be implemented using other ferroelectric memory cells 105. Sense component 1335 may compare a signal from memory cell 1310 (through digit line 1340) with a reference signal from reference component 1330. Upon determining the logic state, the sense component may then store the output in latch 1345, where it may be used in accordance with the operations of an electronic device that memory array 1305 is a part. Sense component 1335 may include a sense amplifier in electronic communication with the latch and the ferroelectric memory cell.

Shunt manager 1360 may be an example of embodiments of the shunt manager 1515 described with reference to FIG. 15. Shunt manager 1360 and/or at least some of its various sub-components may be implemented in hardware, software executed by a processor, firmware, or any combination thereof. If implemented in software executed by a processor, the functions of the shunt manager 1360 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The first shunt manager 1360 and/or at least some of its various sub-components may be physically located at various positions, including being distributed such that portions of functions are implemented at different physical locations by one or more physical devices. In some examples, shunt manager 1360 and/or at least some of its various sub-components may be a separate and distinct component in accordance with various embodiments of the present disclosure. In other examples, shunt manager 1360 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

Shunt manager 1360 may ground or virtually ground a plate coupled to a ferroelectric memory cell as part of an access operation, activate a first switching component coupled between the plate and a digit line of the ferroelectric memory cell during the access operation, and discharge the digit line while the first switching component is activated, where the discharging reduces a voltage of the digit line from a first voltage level to a second voltage level less than the first voltage level. The shunt manager 1360 may also form an array of memory cells, each memory cell including a bottom electrode, a ferroelectric material, and a top electrode, form a plate coupled to the array of memory cells, etch through the plate and at least a portion of a selected memory cell to expose the bottom electrode of the selected memory cell, and form a contact to couple the bottom electrode of the memory cell and the plate.

In some examples, the memory array 1305 may include various means for operating the memory array 1305. For example, the memory array 1305 and/or the memory controller 1315 may include means for grounding or virtually grounding a plate coupled to a ferroelectric memory cell as part of an access operation, means for activating a first switching component coupled between the plate and a digit line of the ferroelectric memory cell during the access operation, and means for discharging the digit line while the first switching component is activated, wherein the discharging reduces a voltage of the digit line from a first voltage level to a second voltage level less than the first voltage level.

In some examples, the memory array 1305 and/or the memory controller 1315 may include means for selecting the ferroelectric memory cell from a plurality of ferroelectric memory cells coupled to the plate based at least in part on performing the access operation. In some examples, the memory array 1305 and/or the memory controller 1315 may include means for activating a second switching component different from the first switching component to couple the plate and the digit line, the second switching component positioned in a parallel circuit configuration with the first switching component. In some examples, the access operation is a precharge portion (e.g., precharge period) performed after a write-back portion of a read operation.

In some examples, the memory array 1305 and/or the memory controller 1315 may include means for applying a first voltage to a gate node of a third switching component for a first duration during the access operation, the third switching component coupled to the digit line and to ground or virtual ground. In some examples, the memory array 1305 and/or the memory controller 1315 may include means for applying a second voltage to the gate node of the third switching component for a second duration after the first duration during the access operation, the second voltage level being higher than the first voltage level. In some examples, the memory array 1305 and/or the memory controller 1315 may include means for coupling a current generator to the digit line during the access operation. In some examples, the memory array 1305 and/or the memory controller 1315 may include means for activating a third switching component coupled to the digit line and the current generator.

Figure 14:
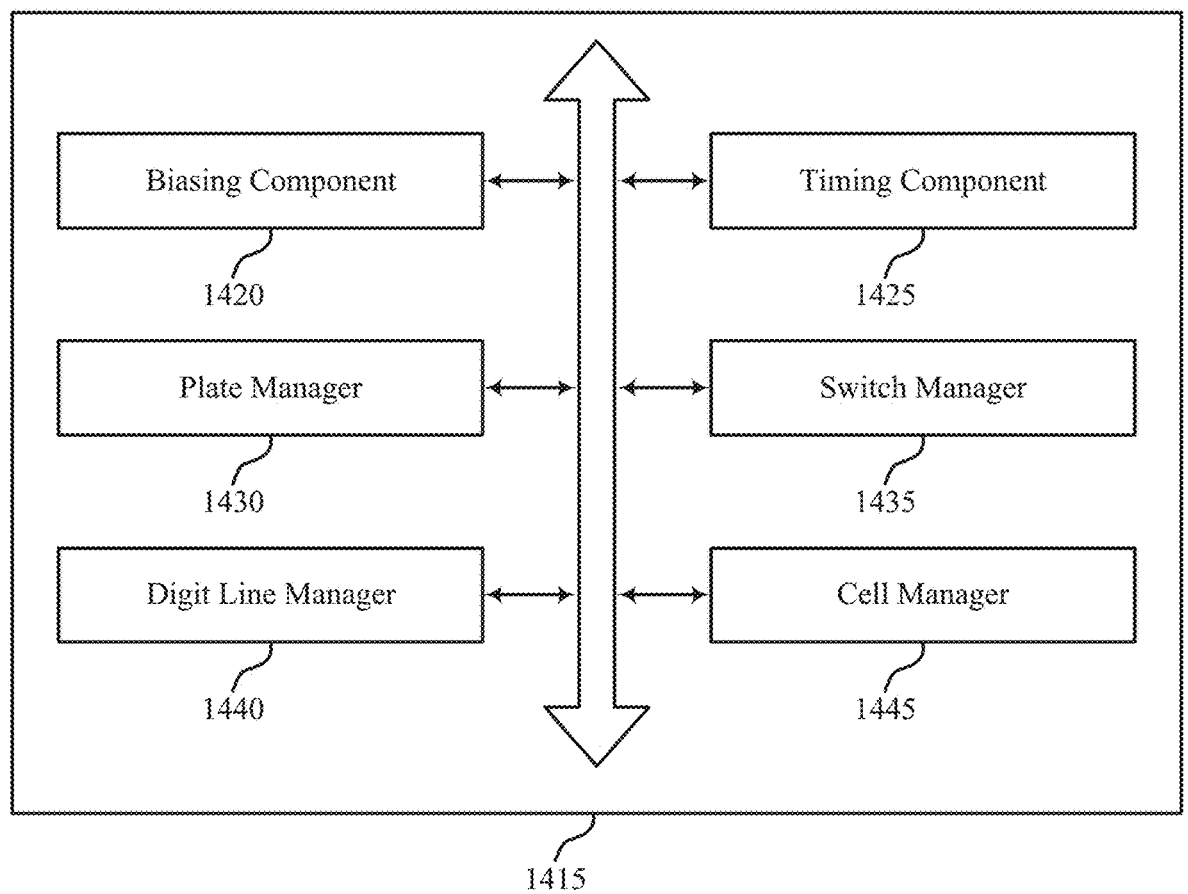

FIG. 14 shows a block diagram 1400 of a shunt manager 1415 that supports techniques to mitigate disturbances of memory cells in accordance with various embodiments of the present disclosure. The shunt manager 1415 may be an example of embodiments of a shunt manager 1515 described with reference to FIGS. 13 and 15. The shunt manager 1415 may include biasing component 1420, timing component 1425, plate manager 1430, switch manager 1435, digit line manager 1440, and cell manager 1445. Each of these modules may communicate, directly or indirectly, with one another (e.g., via one or more buses).

Plate manager 1430 may ground or virtually ground a plate coupled to a ferroelectric memory cell as part of an access operation. In some cases, the access operation is a precharge portion performed after a write-back portion of a read operation.

Switch manager 1435 may activate a first switching component coupled between the plate and a digit line of the ferroelectric memory cell during the access operation, activate a second switching component different from the first switching component to couple the plate and the digit line, the second switching component positioned in a parallel circuit configuration with the first switching component, apply a first voltage to a gate node of a third switching component for a first duration during the access operation, the third switching component coupled to the digit line and to ground or virtual ground, and apply a second voltage to the gate node of the third switching component for a second duration after the first duration during the access operation, the second voltage level being higher than the first voltage level.

Digit line manager 1440 may discharge the digit line while the first switching component is activated, where the discharging reduces a voltage of the digit line from a first voltage level to a second voltage level less than the first voltage level, couple a current generator to the digit line during the access operation, and activate a third switching component coupled to the digit line and the current generator.

Cell manager 1445 may select the ferroelectric memory cell from a set of ferroelectric memory cells coupled to the plate based on performing the access operation.

Figure 15:
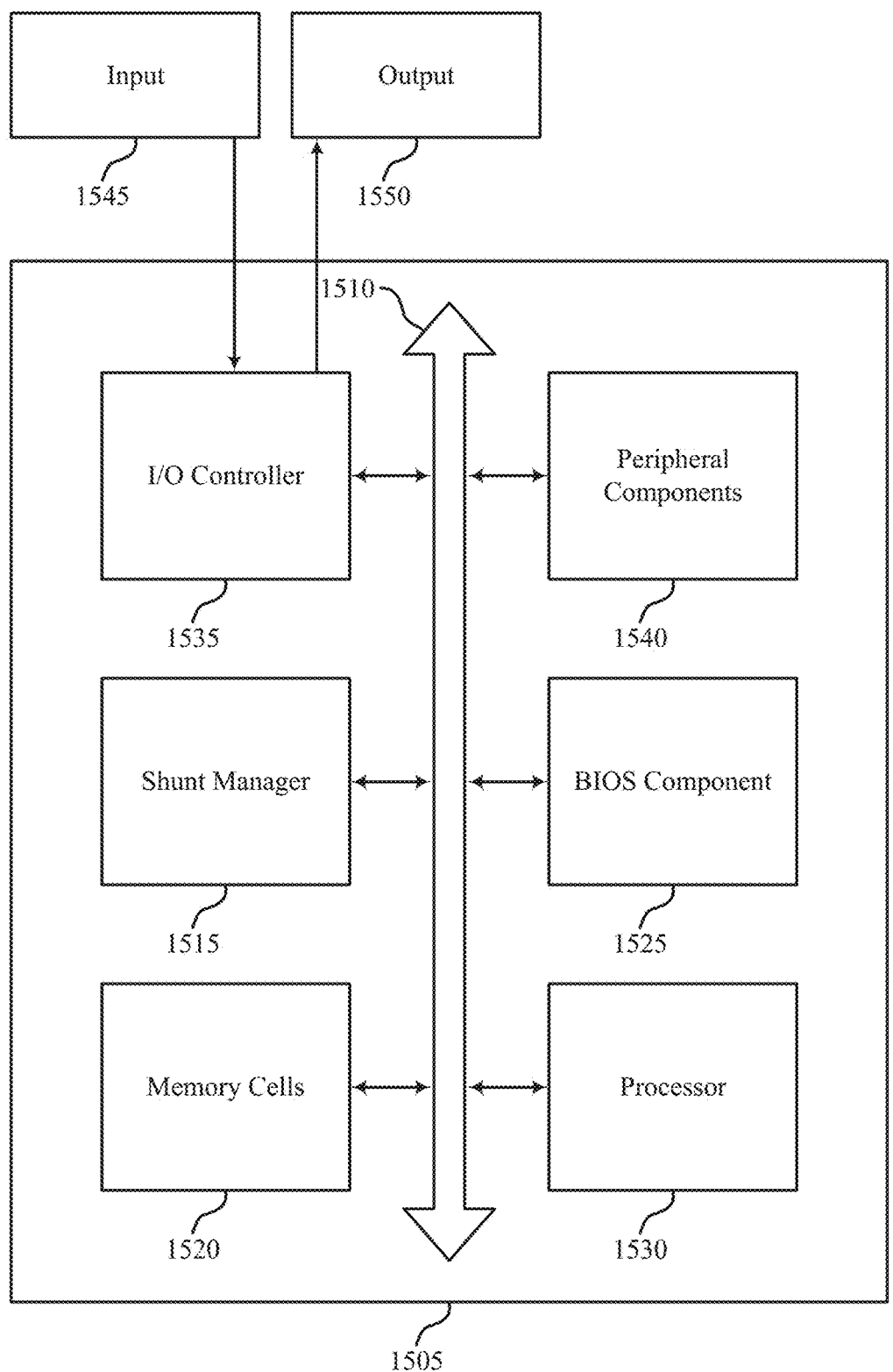
FIG. 15 illustrates a block diagram of a system including a memory controller that support techniques to mitigate disturbances of memory cells in accordance with embodiments of the present disclosure.

FIG. 15 shows a diagram of a system 1500 including a device 1505 that supports techniques to mitigate disturbances of memory cells in accordance with various embodiments of the present disclosure. Device 1505 may be an example of or include the components of memory controller 140 as described above, e.g., with reference to FIG. 1. Device 1505 may include components for bi-directional voice and data communications including components for transmitting and receiving communications, including shunt manager 1515, memory cells 1520, basic input/output system (BIOS) component 1525, processor 1530, I/O controller 1535, and peripheral components 1540. These components may be in electronic communication via one or more busses (e.g., bus 1510). Memory cells 1520 may store information (i.e., in the form of a logical state) as described herein.

BIOS component 1525 be a software component that includes BIOS operated as firmware, which may initialize and run various hardware components. BIOS component 1525 may also manage data flow between a processor and various other components, e.g., peripheral components, input/output control component, etc. BIOS component 1525 may include a program or software stored in read only memory (ROM), flash memory, or any other non-volatile memory.

Processor 1530 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1530 may be configured to operate a memory array using a memory controller. In other cases, a memory controller may be integrated into processor 1530. Processor 1530 may be configured to execute computer-readable instructions stored in a memory to perform various functions (e.g., functions or tasks supporting techniques to mitigate disturbances of memory cells).

I/O controller 1535 may manage input and output signals for device 1505. I/O controller 1535 may also manage peripherals not integrated into device 1505, such as input 1545 and output 1550 peripherals. In some cases, I/O controller 1535 may represent a physical connection or port to an external peripheral. In some cases, I/O controller 1535 may utilize an operating system such as iOS®, ANDROID®, MS-DOS®, MS-WINDOWS®, OS/2®, UNIX®, LINUX®, or another known operating system. In other cases, I/O controller 1535 may represent or interact with a modem, a keyboard, a mouse, a touchscreen, or a similar device. In some cases, I/O controller 1535 may be implemented as part of a processor. In some cases, a user may interact with device 1505 via I/O controller 1535 or via hardware components controlled by I/O controller 1535.

Peripheral components 1540 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Figure 16:
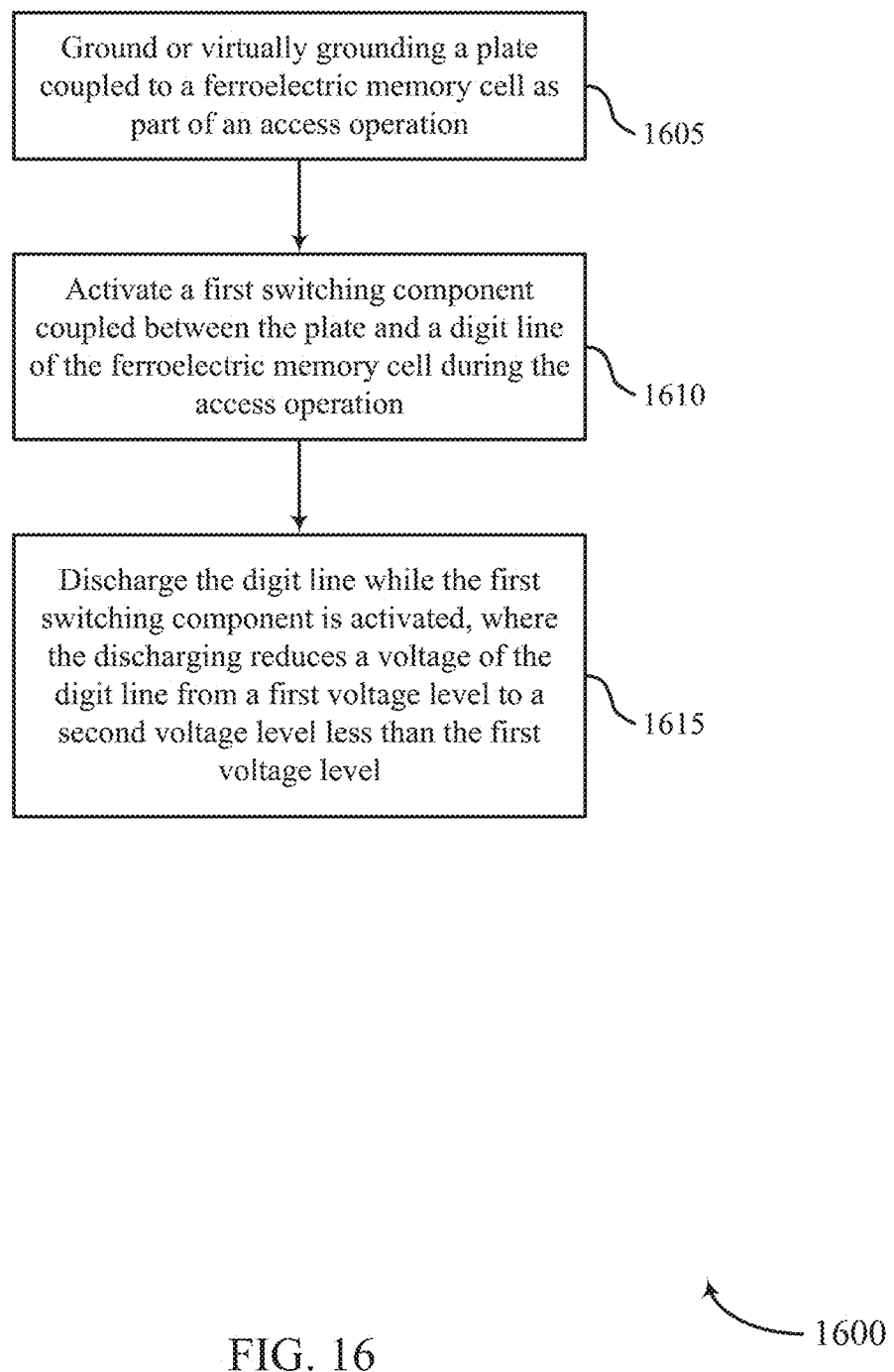
FIGS. 16 through 17 illustrate methods for techniques to mitigate disturbances of memory cells in accordance with embodiments of the present disclosure.

FIG. 16 shows a flowchart illustrating a method 1600 for techniques to mitigate disturbances of memory cells in accordance with various embodiments of the present disclosure. The operations of method 1600 may be implemented by a memory controller 140 or its components as described herein. For example, the operations of method 1600 may be performed by a shunt manager as described with reference to FIGS. 13 through 15. In some examples, a memory controller 140 may execute a set of codes to control the functional elements of the device to perform the functions described below. Additionally or alternatively, the memory controller 140 may perform embodiments of the functions described below using special-purpose hardware.

At block 1605 the memory controller 140 may ground or virtually ground a plate coupled to a ferroelectric memory cell as part of an access operation. The operations of block 1605 may be performed according to the methods described with reference to FIGS. 1 through 12. In certain examples, embodiments of the operations of block 1605 may be performed by a plate manager as described with reference to FIGS. 13 through 15.

At block 1610 the memory controller 140 may activate a first switching component coupled between the plate and a digit line of the ferroelectric memory cell during the access operation. The operations of block 1610 may be performed according to the methods described with reference to FIGS. 1 through 12. In certain examples, embodiments of the operations of block 1610 may be performed by a switch manager as described with reference to FIGS. 13 through 15.

At block 1615 the memory controller 140 may discharge the digit line while the first switching component is activated, wherein the discharging reduces a voltage of the digit line from a first voltage level to a second voltage level less than the first voltage level. The operations of block 1615 may be performed according to the methods described with reference to FIGS. 1 through 12. In certain examples, embodiments of the operations of block 1615 may be performed by a digit line manager as described with reference to FIGS. 13 through 15. In some cases, the access operation is a precharge portion performed after a write-back portion of a read operation.

Figure 17:
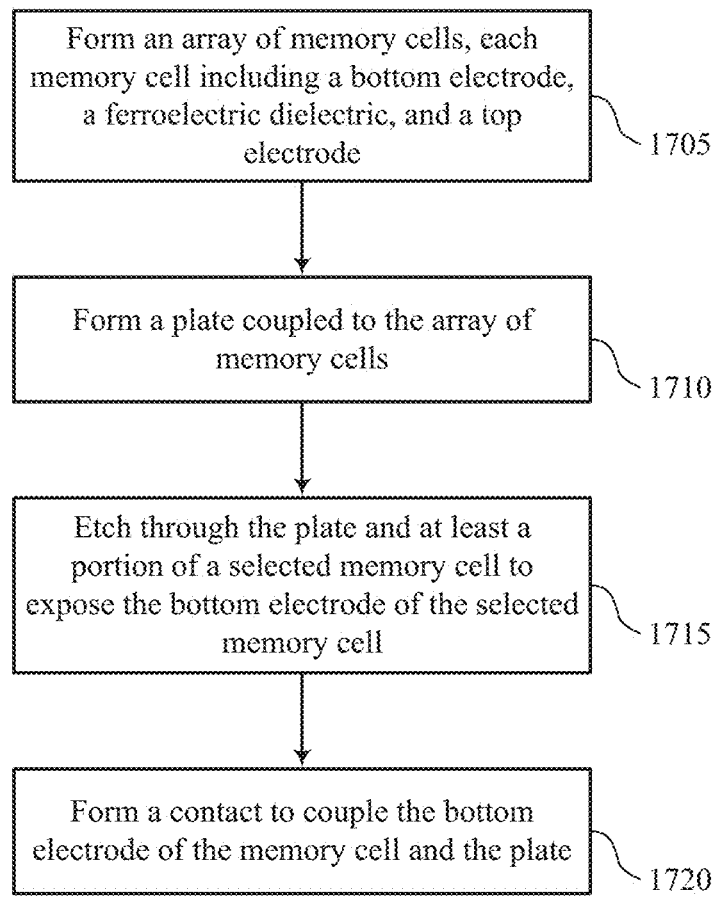

FIG. 17 shows a flowchart illustrating a method 1700 for techniques to mitigate disturbances of memory cells in accordance with various embodiments of the present disclosure. In the method 1700, materials or components may be formed through various combinations of material deposition and removal. In some cases, material formation or removal may include one or more photolithography steps not recited or described explicitly but understood by those skilled in the art.

At block 1705, the method 1700 may include forming an array of memory cells, each memory cell comprising a bottom electrode, a ferroelectric material, and a top electrode.

At block 1710, the method 1700 may include forming a plate coupled to the array of memory cells.

At block 1715, the method 1700 may include etching through the plate and at least a portion of a selected memory cell to expose the bottom electrode of the selected memory cell.

At block 1720, the method 1700 may include forming a contact to couple the bottom electrode of the memory cell and the plate. In some cases, forming the contact further includes depositing a high-resistance material.

In some examples, a manufacturing method may be provided to form the memory array. In some examples, the method may include forming an array of memory cells, each memory cell comprising a bottom electrode, a ferroelectric material, and a top electrode, forming a plate coupled to the array of memory cells, etching through the plate and at least a portion of a selected memory cell to expose the bottom electrode of the selected memory cell, and forming a contact to couple the bottom electrode of the memory cell and the plate. In some examples, forming the contact further comprises depositing a high-resistance material, etching a portion of the high-resistance material, and depositing a low-resistance material in an area etched free of the high-resistance material. In some examples, forming the contact further comprises depositing a high-resistance material that conforms to a surface, and depositing a low-resistance material in an area formed by the conforming high-resistance material. In some examples, the method may include depositing a dielectric layer (e.g., oxidizing layer or insulating layer) on top of the contact. In some examples, the method may include forming a metal layer directly above the contact, wherein the dielectric layer is positioned between a top surface of the contact and the metal layer.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured to and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure, each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    forming an array of memory cells, each memory cell comprising a bottom electrode, a ferroelectric material, and a top electrode;

forming a plate coupled to the array of memory cells;
etching through the plate and at least a portion of a selected memory cell to expose the bottom electrode of the selected memory cell; and
forming a contact to couple the bottom electrode of the memory cell and the plate.

2. The method of claim 1, wherein forming the contact further comprises:
depositing a first material having a first resistance;
etching a portion of the first material; and
depositing a second material having a second resistance lower than the first resistance in an area etched free of the first material.

3. The method of claim 1, further comprising:
depositing a dielectric layer on top of the contact.

4. The method of claim 3, further comprising:
forming a metal layer directly above the contact, wherein the dielectric layer is positioned between a top surface of the contact and the metal layer.

5. The method of claim 3, further comprising:
forming a metal layer that does not extend above the contact.

6. The method of claim 1, wherein forming each memory cell of the array of memory cells comprises:
depositing a first dielectric material on a substrate;
etching a container into the first dielectric material; and
depositing a first material into the container to form the bottom electrode.

7. The method of claim 6, wherein forming the memory cell further comprises:
etching at least a portion of the first material in the container.

8. The method of claim 7, wherein forming the memory cell further comprises:
depositing the ferroelectric material into the container onto the bottom electrode after etching the at least the portion of the first material in the container.

9. The method of claim 8, wherein forming the memory cell further comprises:
depositing the first material the container onto the ferroelectric material to form at least a portion of the top electrode.

10. The method of claim 9, wherein forming the memory cell further comprises:
etching at least a portion of the ferroelectric material in the container before depositing the first material into the container.

11. The method of claim 9, wherein forming the memory cell further comprises:
depositing a second material into the container onto the first material of the top electrode to form a second portion of the top electrode.

12. The method of claim 11, wherein forming the memory cell further comprises:
etching at least a portion of the first material in the container before depositing the second material into the container.

13. The method of claim 6, wherein forming the memory cell further comprises:
etching or planarizing the memory cell to form a top planar surface of the memory cell.

14. The method of claim 13, wherein forming the plate comprises:
depositing the first material on the top planar surface to form a first layer of the plate;
etching at least a portion of the first material on the top planar surface; and
depositing a second material into an area of the first material that was etched away to form a second layer of the plate.

15. The method of claim 7, wherein forming the memory cell further comprises:
depositing a dielectric material into the container onto the bottom electrode after etching the at least the portion of the first material in the container.

16. A method, comprising:
forming an array of memory cells at least partially surrounded by a first dielectric material;
forming a second dielectric material above the first dielectric material;
forming a plate coupled to each memory cell of the array of memory cells; and
forming a contact to couple a bottom electrode of at least one memory cell of the array of memory cells with the plate, wherein forming the contact further comprises:
depositing a first material comprising titanium nitride;
etching a portion of the first material; and
depositing a second material comprising tungsten in an area etched free of the first material.

17. The method of claim 16, further comprising:
forming an intermediate material between the first dielectric material and the second dielectric material.

18. The method of claim 16, wherein the bottom electrode is coupled with a digit line associated with the array of memory cells.

19. A method, comprising:
forming an array of memory cells, each memory cell comprising a bottom electrode, a ferroelectric material, and a top electrode;
forming a contact at an edge of the array of memory cells to couple a first bottom electrode of a first memory cell of the array of memory cells with a plate, wherein the contact has a first height above a surface of the plate; and
forming a metal layer at about the same height above the surface of the plate.

* * * * *